US 6,670,811 B2

(12) United States Patent
Wind et al.

(10) Patent No.: US 6,670,811 B2
(45) Date of Patent: *Dec. 30, 2003

(54) METHOD FOR HIGH RESOLUTION MAGNETIC RESONANCE ANALYSIS USING MAGIC ANGLE TECHNIQUE

(75) Inventors: Robert A. Wind, West Richland, WA (US); Jian Zhi Hu, Richland, WA (US)

(73) Assignee: Battelle Memorial Institute, Richland, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/094,455

(22) Filed: Mar. 7, 2002

(65) Prior Publication Data

US 2002/0125887 A1 Sep. 12, 2002

Related U.S. Application Data

(63) Continuation-in-part of application No. 09/803,381, filed on Mar. 9, 2001.

(51) Int. Cl.[7] .................................................. G01V 3/00
(52) U.S. Cl. ........................ 324/307; 324/309; 324/314
(58) Field of Search ................................ 324/307, 321, 324/300, 309, 306, 318

(56) References Cited

U.S. PATENT DOCUMENTS

| | | | |
|---|---|---|---|
| 4,301,410 A | 11/1981 | Wind et al. | |
| 4,352,066 A | 9/1982 | Kendrick et al. | |
| 4,511,841 A | 4/1985 | Bartuska et al. | |
| 4,654,593 A | * 3/1987 | Ackerman | 324/307 |
| 5,208,536 A | 5/1993 | Cory | |
| 5,227,725 A | 7/1993 | Cory | 324/309 |
| 5,260,657 A | 11/1993 | Lewis et al. | |
| 5,327,085 A | 7/1994 | Cory | 324/307 |
| 5,872,452 A | 2/1999 | Cory et al. | |
| 6,133,733 A | 10/2000 | Lurie et al. | |
| 2002/0135365 A1 | * 9/2002 | Wind et al. | 324/307 |
| 2002/1215887 | * 9/2002 | Wind et al. | 324/307 |

OTHER PUBLICATIONS

Alderman et al., *Mol. Physics*, 96(6):1113–1126, 1998.
Antzutkin et al., *J. Magnetic Resonance*, 115:7–19, 1995.
Bax et al., *J. Magnetic Resonance*, 52:147–152, 1983.
Bradbury et al., *Physics Letters*, 26A(9):405–406, 1968.
Chen et al., *J. Am. Chem. Soc.*, 123:9200–9201, 2001.
Cheng et al., *PNAS USA*, 94:6408–6413, 1997.
Gan, *J. Am. Chem. Soc.*, 114:8307–8309, 1992.
Hu et al., *Solid State Nuclear Magnetic Resonance*, 2:235–243, 1993.
Hu et al., *J. Magnetic Resonance*, 105:82–87, 1993.
Hu et al., *J. Magnetic Resonance*, 113:210–222, 1995.

(List continued on next page.)

*Primary Examiner*—Diego Gutierrez
*Assistant Examiner*—Tiffany A. Fetzner
(74) *Attorney, Agent, or Firm*—Klarquist Sparkman, LLP

(57) ABSTRACT

A method of performing a magnetic resonance analysis of a biological object that includes placing the object in a main magnetic field (that has a static field direction) and in a radio frequency field; rotating the object at a frequency of less than about 100 Hz around an axis positioned at an angle of about 54°44' relative to the main magnetic static field direction; pulsing the radio frequency to provide a sequence that includes a phase-corrected magic angle turning pulse segment; and collecting data generated by the pulsed radio frequency. The object may be reoriented about the magic angle axis between three predetermined positions that are related to each other by 120°. The main magnetic field may be rotated mechanically or electronically. Methods for magnetic resonance imaging of the object are also described.

53 Claims, 22 Drawing Sheets

OTHER PUBLICATIONS

Hu et al., "Magic Angle Turning & Hopping," in *Encyclopedia of Magnetic Resonance*, Grant and Harris, eds., New York, John Wiley & Sons: 2914–2921, 1996.

Leu et al., *Chemical Physics Letters*, 332:344–350, 2000.

Lin et al., "Manipulation of Phase and Amplitude Modulation of Spin Magnetization in Magic Angle Spinning NMR in the Presence of Molecular Diffusion," *J. Chem Physics*, in press.

Morris and Freeman, *J. Magnetic Resonance*, 29:433–462, 1978.

Weybright et al., *MRM*, 39:337–344, 1998.

Wind et al., *Magnetic Resonance in Medicine* 46:213–218, 2001.

Hesse et al., 22$^{nd}$ *Discussion Meeting of the GDCh Division "Magnetische Resonanzspektroskopie, Progress in the Magnetic Resonance of Bioactive Compounds and New Materials*," Online: www.uni–jena.de/}p6hest/news/00gdch.htm (Sep. 2000).

Hughes et al., "*Flourine–19 Solid–State NMR Magic–Angle–Turning Experiments Using Multiple–Pulse Homonuclear Decoupling*," Journal of Magnetic Resonance, vol. 138, No. 2. pp. 256–267 (Jun. 1999).

Jager et al., "*Diskussionstagung der Fachgruppe Magnetische Resonanz Der Gesellschaft Deutscher Chemiker*," Online: www.uni–jena.de/}p6hest/news/99gdch.htm/ (Sep. 1999).

Ni et al., "*Low–Speed Magic–Angle–Spinning Carbon–13 NMR of Fruit Tissue*," Journal of Agricultural and Food Chemistry, Department of Food Science and Whistler Center for Carbohydrate Research, Purdue University, vol. 40, No. 9, pp. 1507–1513 (1992).

Waters et al., "*High–Resolution Magic Angle Spinning* $^1$H *NMR Spectroscopy of Intact Liver and Kidney: Optimization of Sample Preparation Procedures and Biochemical Stability of Tissue during Spectral Acquisition*," Analytical Biochemistry, vol. 282, No. 1, pp. 16–23 (Jun. 2000).

Wind et al., "*An investigation of rat mammary healthy and R3230AC tumor tissues and cells by means of solid–state* $^{13}C$ *NMR*," Solid State Nuclear Magnetic Resonance, vol. 7, No. 3, pp. 263–269 (Dec. 1996).

\* cited by examiner

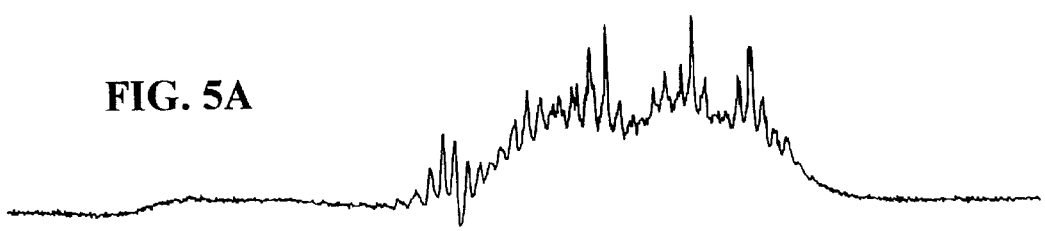
FIG. 5A
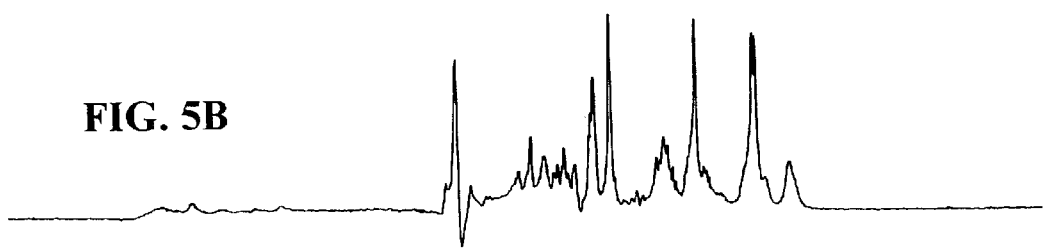
FIG. 5B
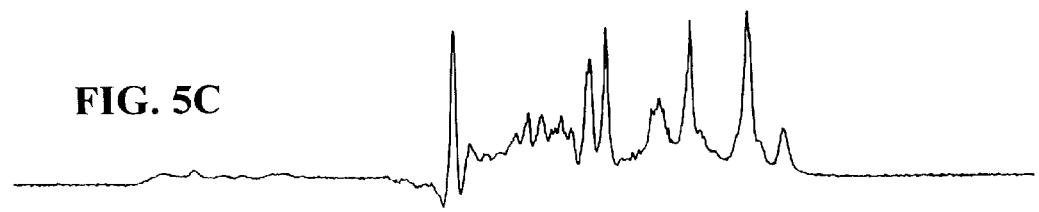
FIG. 5C
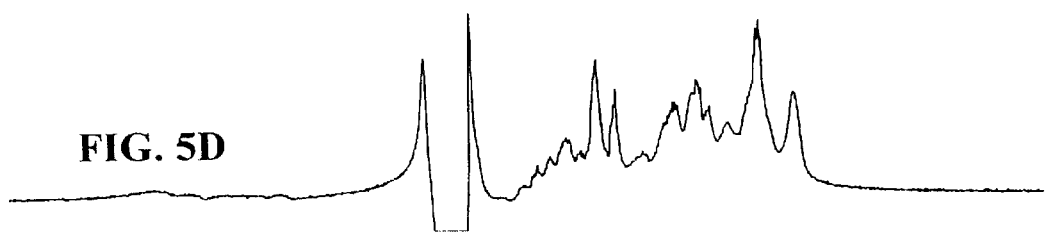
FIG. 5D
FIG. 5E
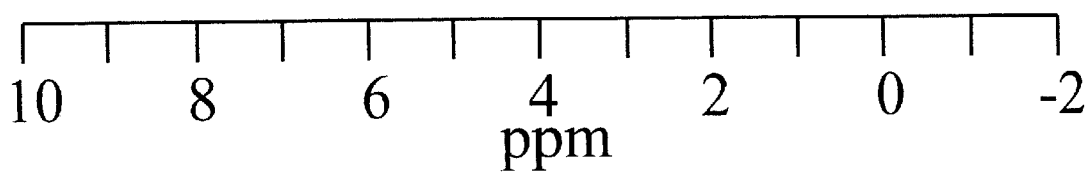

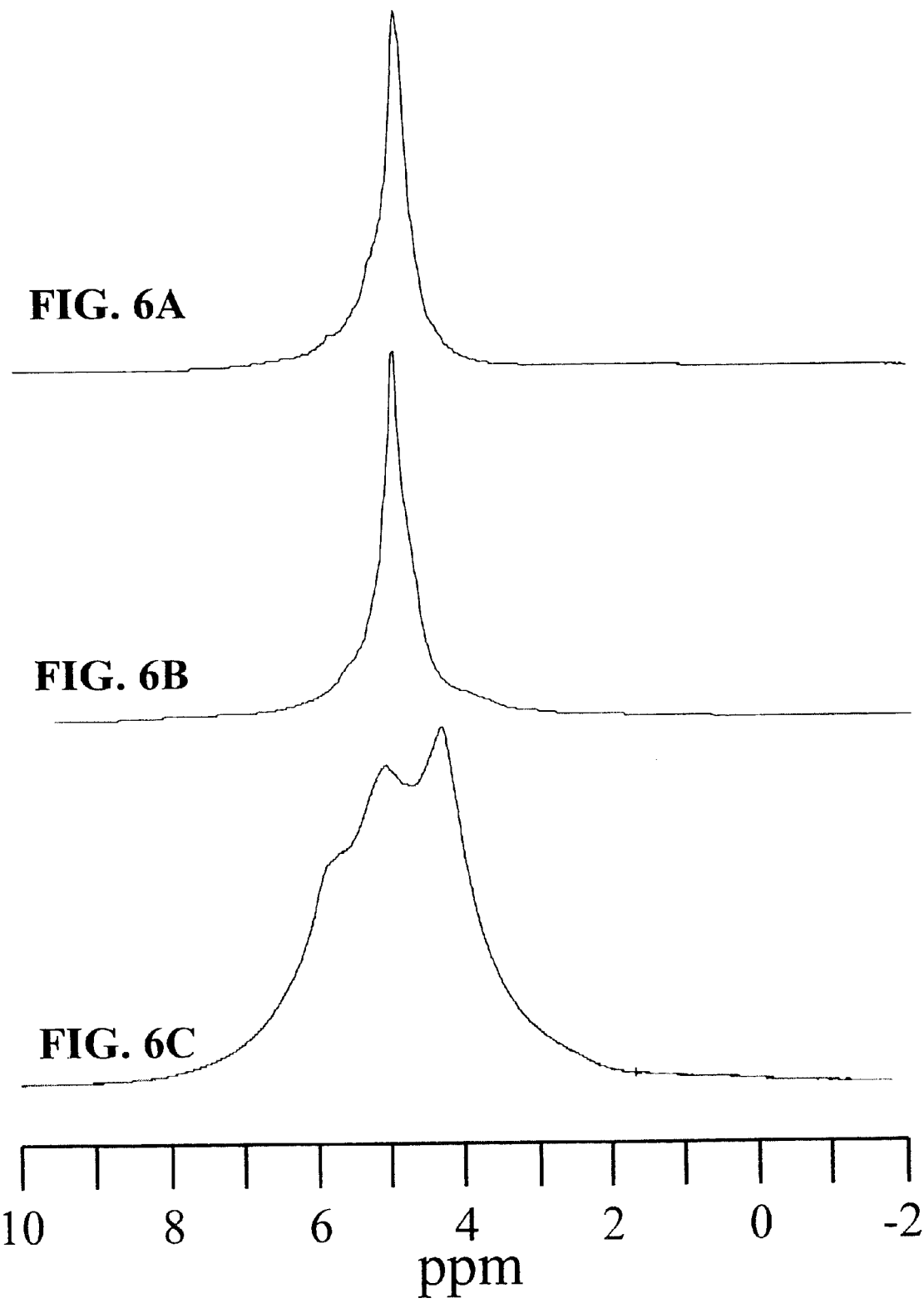

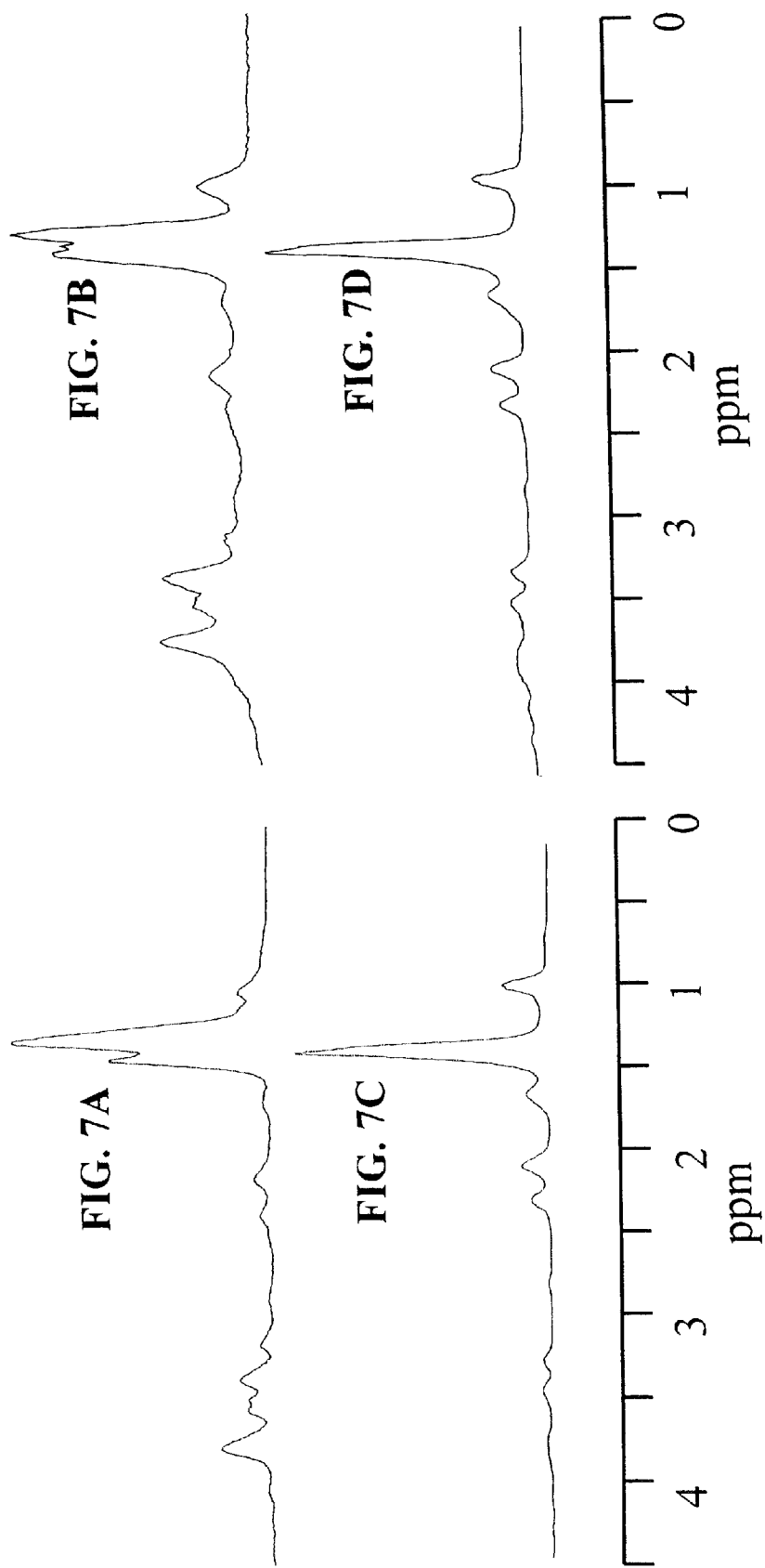

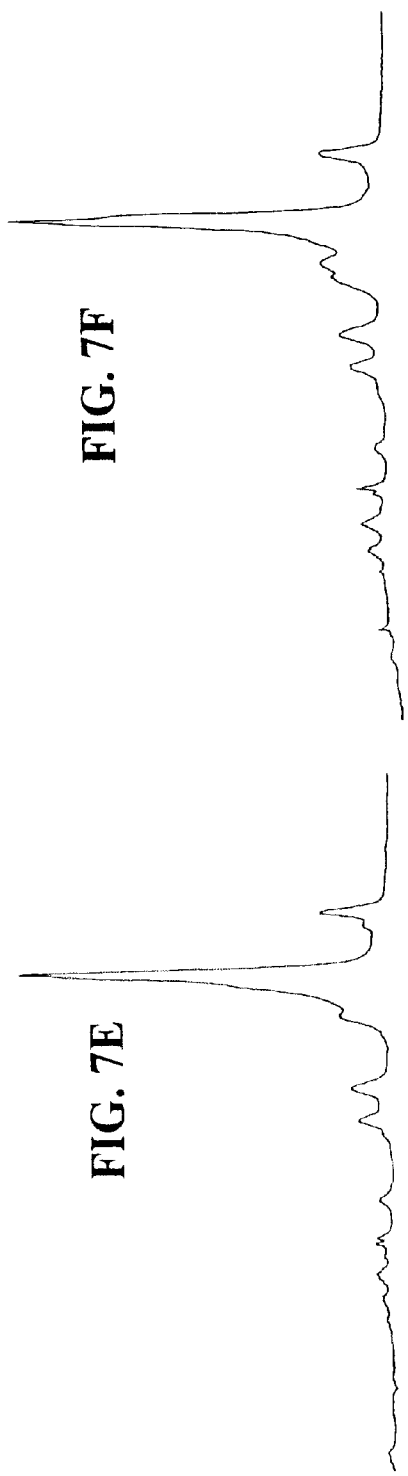
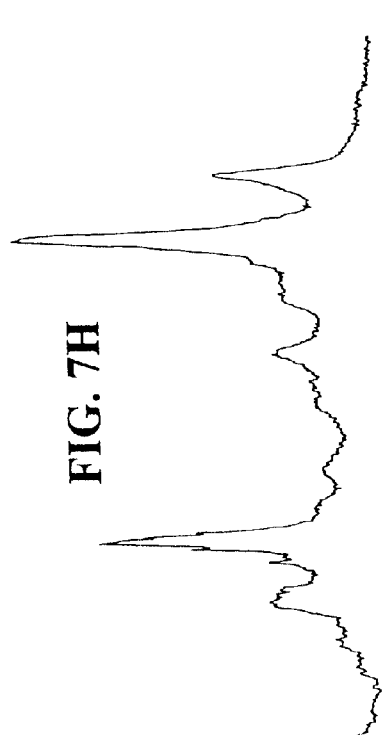
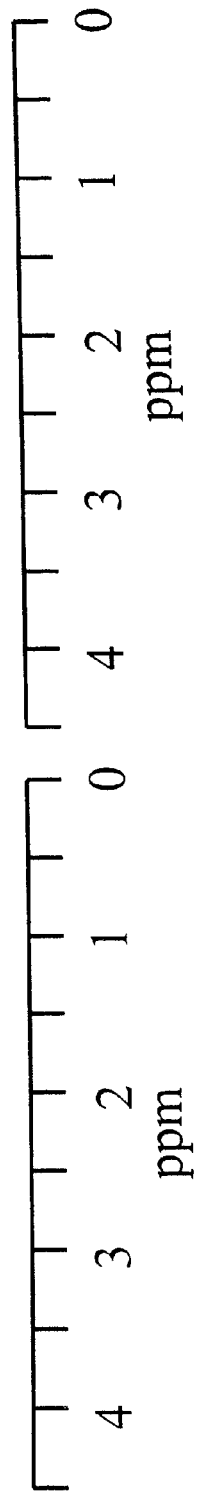
FIG. 7E
FIG. 7F
FIG. 7G
FIG. 7H

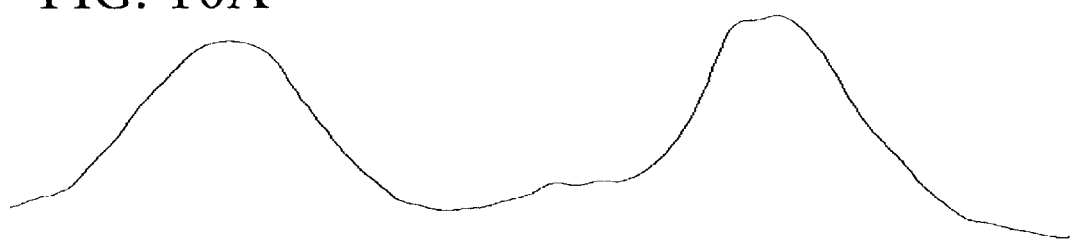
FIG. 10A
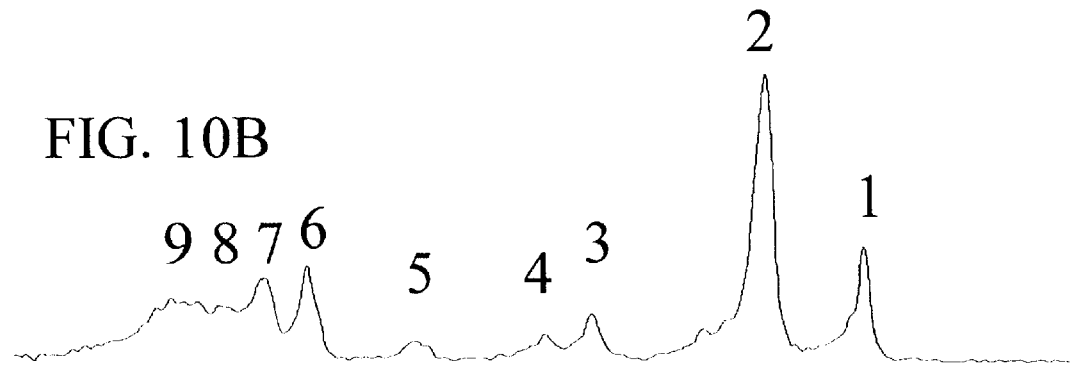
FIG. 10B
FIG. 10C
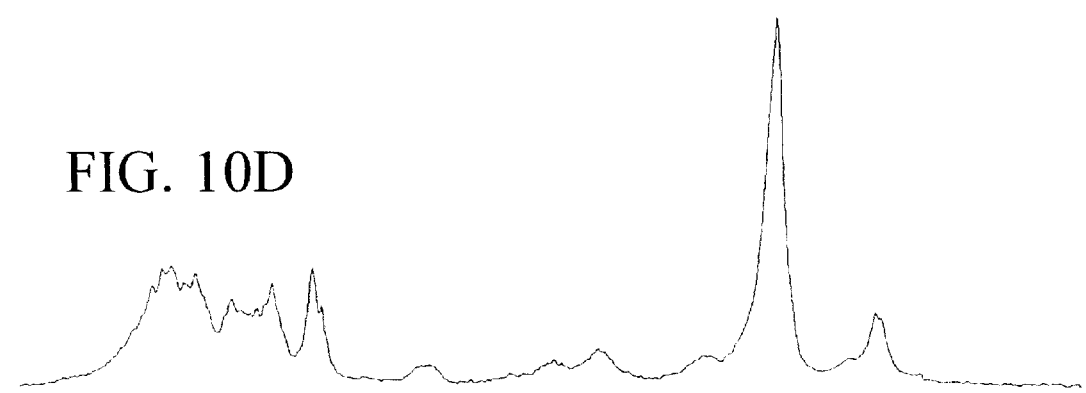
FIG. 10D
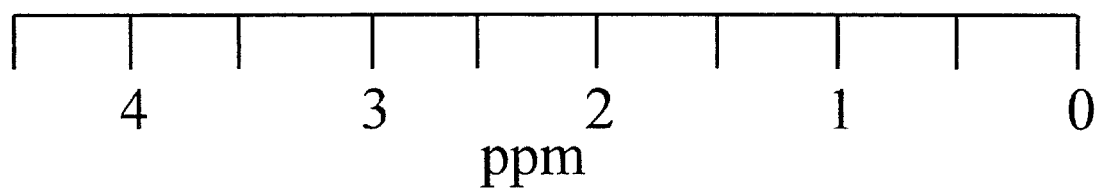

(a): RF pulses
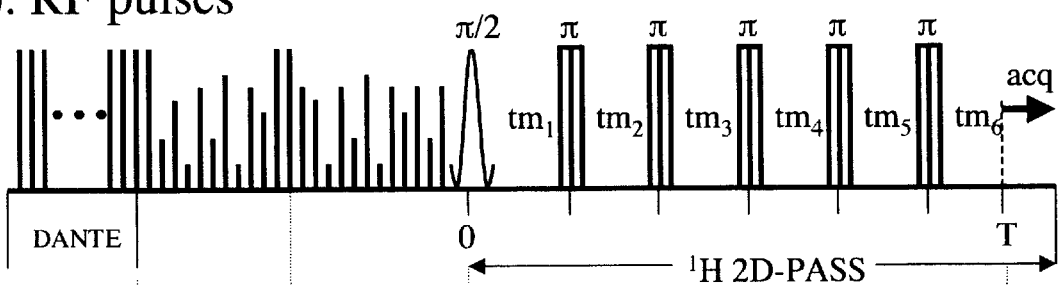
DANTE
¹H 2D-PASS
(b): Gradients
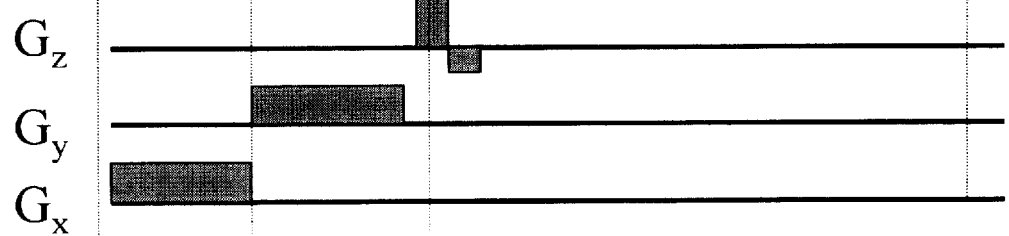
(C): RF spectrum
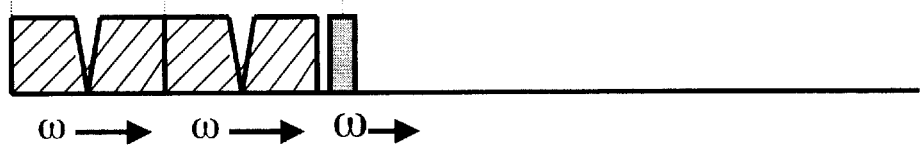
FIG. 14E

METHOD FOR HIGH RESOLUTION MAGNETIC RESONANCE ANALYSIS USING MAGIC ANGLE TECHNIQUE

PRIORITY CLAIM

This application is a continuation-in-part of U.S. application Ser. No. 09/803,381, filed Mar. 9, 2001, incorporated herein by reference.

STATEMENT OF GOVERNMENT SUPPORT

This invention was made with United States Government support under Contract DE-AC0676RLO1830 awarded by the U.S. Department of Energy. The United States Government has certain rights in the invention.

FIELD

The present disclosure relates to magnetic resonance (MR) analysis, particularly to magnetic resonance spectroscopy (MRS) and imaging (MRI) of biological objects.

BACKGROUND

Magnetic resonance is a phenomenon exhibited by a select group of atomic nuclei and is based upon the existence of nuclear magnetic moments in these nuclei (termed "gyromagnetic" nuclei). When a gyromagnetic nucleus is placed in a strong, uniform and steady magnetic field (a so-called "external field" and referred to herein as a "static" magnetic field), it precesses at a natural frequency known as a Larmor frequency. The Larmor frequency is characteristic of each nuclear type and is dependent on the applied field strength in the location of the nucleus. Typical gyromagnetic nuclei include $^1$H (protons), $^{13}$C, $^{19}$F and $^{13}$P. The precession frequencies of the nuclei can be observed by monitoring the transverse magnetization that results after a strong RF pulse applied at or near their Larmor frequencies. It is common practice to convert the measured signal to a frequency spectrum by means of Fourier transformation.

More specifically, when a bulk sample containing nuclear magnetic resonance (NMR) active nuclei is placed within a magnetic field, the nuclear spins distribute themselves amongst the nuclear magnetic energy levels in accordance with Boltzmann's statistics. This results in a population imbalance between the energy levels and a net nuclear magnetization. It is this net nuclear magnetization that is studied by NMR techniques.

At equilibrium, the net nuclear magnetization is aligned parallel to the external magnetic field and is static. A second magnetic field perpendicular to the first and rotating at, or near, the Larmor frequency can be applied to induce a coherent motion of the net nuclear magnetization. Since, at conventional field strengths, the Larmor frequency is in the megahertz frequency range, this second field is called a "radio frequency" or RF field.

In particular, a short (microsecond) pulse of RF radiation is applied to the sample in the static magnetic field; this pulse is equivalent to irradiating at a range of frequencies. The free induction decay (FID) in response to the RF pulse is measured as a function of time. The response of the sample to the pulse depends upon the RF energy absorption of the sample over a range of frequencies applied (for example, 500 MHz±2500 Hz). Often the pulse is applied many times and the results are averaged to improve the signal-to-noise ratio.

The coherent motion of the nuclear magnetization about the RF field is called a "nutation." In order to deal conveniently with this nutation, a reference frame is used which rotates about the z-axis at the Larmor frequency. In this "rotating frame" part of the RF field, which is rotating in the stationary "laboratory" reference frame in the same direction as the magnetization, is static. Consequently, the effect of the RF field is to rotate the nuclear magnetization direction at an angle with respect to the main static field direction. By convention, an RF field pulse of sufficient length to rotate the nuclear magnetization through an angle of 90° or $\pi/2$ radians is called a "$\pi/2$ pulse."

A $\pi/2$ pulse applied with a frequency near the nuclear resonance frequency will rotate the spin magnetization from an original direction along the main static magnetic field direction into a plane perpendicular to the main magnetic field direction. The component of the net magnetization that is transverse to the main magnetic field precesses about the main magnetic field at the Larmor frequency. This precession can be detected with a receiver coil that is resonant at the precession frequency and located such that the precessing magnetization induces a voltage across the coil. Frequently, the "transmitter coil" employed for generating the RF field to the sample and the "receiver coil" employed for detecting the magnetization are one and the same coil.

In addition to precessing at the Larmor frequency, in the absence of the applied RF field, the nuclear magnetization also undergoes two relaxation processes: (1) the precessions of various individual nuclear spins which generate the net nuclear magnetization become dephased with respect to each other so that the magnetization within the transverse plane loses phase coherence (so-called "spin-spin relaxation") with an associated relaxation time, $T_2$, and (2) the individual nuclear spins return to their equilibrium population of the nuclear magnetic energy levels (so-called "spin-lattice relaxation") with an associated relaxation time, $T_1$. The spin-spin relaxation is caused by the presence of small local magnetic fields, arising from the electrons, magnetic nuclei, and other magnetic dipoles surrounding a particular nucleus. These fields cause slight variations in the resonance frequency of the individual nuclei, which results in a broadening of the NMR resonance line. Often this broadening is caused by two types of local fields: a static component, which gives rise to a so-called inhomogeneous broadening, and local fields which are fluctuating in time as a result of molecular motions and interactions between magnetic nuclei. The latter phenomenon results in a so-called homogeneous broadening.

Magnetic resonance imaging and magnetic resonance spectroscopy are used extensively in biological research and medicine, both for in vitro investigations of cells and tissues and for in vivo measurements on animals and humans. Both methods are non-invasive and non-destructive and are used for a large variety of applications, including the detection and diagnosis of lesions and diseases, and the evaluation of therapy response. One particularly useful MRS technique is $^1$H nuclear magnetic resonance (NMR) spectroscopy. $^1$H NMR spectroscopy has been used extensively to study metabolic changes in diseased cells and tissues and the effects of therapy. The resonance lines corresponding to several key mobile compounds have been observed, and their spectral intensities have been linked to the tumor phenotype, tumorigenesis, tumor size, increased proliferation of cells, cell apoptosis, and necrosis.

However, a serious problem associated with these applications is the relatively large widths of the MR resonance lines that are observed using conventional MRI and MRS. This reduces the MRI and MRS sensitivity, and, for MRS, can result in severely overlapping spectral lines, which seriously hampers the analysis of the spectrum. It has been established that in biological materials the line widths are mainly caused by inhomogeneous broadening. In intact cells and tissues, the possible mechanisms that broaden the lines inhomogeneously include residual chemical shift anisotropy interaction and local magnetic field gradients arising from variations in the bulk magnetic susceptibility at the various compartment boundaries present in the cells and tissues. It is believed in the art that the bulk magnetic susceptibility variations are the main mechanisms responsible for the broadening. Using cell extracts can eliminate this broadening, but this procedure cannot be applied in live subjects, it is time consuming and may introduce spectral artifacts.

It is well known that the susceptibility broadening and other inhomogeneous broadening mechanisms can be eliminated by magic angle spinning (MAS), where the sample is rotated about an axis with an angle of 54° 44' (or $\cos^{-1}(3^{-\frac{1}{2}})$) with respect to the static magnetic field direction. A problem with MAS is that when the value of the spinning rate is small compared to the width of the broadening, the resonant peak splits into a group of spinning sidebands (SSBS) separated by the spinning rate. If the value of the spinning rate is less than the isotropic spectral width, the analysis of the spectra becomes considerably difficult due to the overlapping of the SSBs associated with the different resonant peaks. This problem can be avoided by increasing the spinning rate to eliminate the SSBs in the spectral region of interest. Indeed it has been shown that fast MAS, where a sample is rotated at a speed of several kHz, produces a significant narrowing of the MR lines in cells and tissues (see Weybright et al., *Gradient, High-Resolution, Magic Angle Spinning $^1H$ Nuclear Magnetic Resonance Spectroscopy of Intact Cells*, Magnetic Resonance in Medicine 1998; 39: 337–345; and Cheng et al., *Quantitative Neuropathology by High Resolution Magic Angle Spinning Proton Magnetic Resonance Spectroscopy*, Proc. Natl. Acad. Sci. USA 1997; 94: 6408–6413). However, the large centrifugal force associated with such high spinning rates destroys the tissue structure and even part of the cells (see Weybright et al.). Consequently, MAS at a high spinning speed is not suitable, for example, to map the metabolite distribution in intact biological tissues or to study live cells, and is impossible to use on live subjects.

A possible way to overcome the problems associated with fast MAS is to use slow sample spinning. Many methods have been developed in solid state NMR to eliminate the spinning sidebands or to separate them from the isotropic spectrum so that a sideband free isotropic chemical shift spectrum is obtained. One approach is the so-called magic angle turning (MAT) techniques, and sideband free isotropic chemical shift spectra have been obtained in solids at spinning rates as low as 30 Hz (Hu et al., *Magic Angle Turning and Hopping*, in Encyclopedia of Magnetic Resonance D. M. Grant, and R. K. Harris, Eds. New York: John Wiley & Sons: 1996, 2914–2921).

MAT is a two dimensional (2D) NMR technique that was developed to determine the chemical shift tensors of rare spins such as $^{13}C$ and $^{15}N$ in solids. There are basically two types of MAT experiments. The first type (MAT-1) is based on the Magic Angle Hopping (MAH) experiment pioneered by Bax et al., *Correlation of Isotropic Shifts and Chemical Shift Anisotropies by Two-Dimensional Fourier-Transform Magic-Angle Hopping NMR Spectroscopy*, J. Magn. Reson. 1983; 52: 147. The second class (MAT-2) involves the use of five radio frequency π pulses during a constant evolution time period (e.g., one rotor period). MAT-2 techniques include the five π replicated magic angle turning (FIREMAT) (Hu et al., *An Isotropic Chemical Shift-Chemical Shift Anisotropy Magic Angle Slow-Spinning 2D NMR Experiment*, J. Magn. Reson. 1993; A 105: 82–87; and Alderman et al., *A sensitive, high resolution magic angle turning experiment for measuring chemical shft tensor principal values*, Molecular Physics 1998; 95(6): 1113–1126) and the 2D-phase-altered spinning sidebands (PASS) techniques (Antzutkin et al., *Two-Dimensional Sideband Separation in Magic-Angle-Spinning NMR,*. J. Magn. Reson 1995; A 115: 7–19). All of these experiments are 2D isotropic-anisotropic chemical shift correlation experiments yielding a high resolution isotropic chemical shift dimension and a chemical shift anisotropy dimension. Although MAT has been applied in solid state NMR (see Hu et al., *Magic Angle Turning and Hopping*; Gan et al., *High-Resolution Chemical Shift and Chemical Shift Anisotropy Correlation in Solids Using Slow Magic Angle Spinning*, J. Am. Chem. Soc. 1992; 114: 8307–8309; Hu et al., *Magic-Angle-Turning Experiments for Measuring Chemical-Shift-Tensor Principal Values in Powdered Solids*, J. Magn. Reson. 1995: A 113: 210–222; Hu et al., *An Isotropic Chemical Shift-Chemical Shift Anisotropy Magic Angle Slow-Spinning 2D NMR Experiment*; Alderman et al., *A Sensitive, High Resolution Magic Angle Turning Experiment for Measuring Chemical Shift Tensor Principal Values*; and Antzutkin et al., *Two-Dimensional Sideband Separation in Magic-Angle-Spinning NMR*), its potential for biological research has not been explored.

One of the reasons that MAT for biological objects, as opposed to solid objects, has not been investigated is the belief that the diffusion of the molecules containing the nuclei of interest in the internal static local magnetic fields results in a time-dependent field as experienced by the nuclei. This effect worsens if the spinning frequency is reduced, resulting in imperfect suppression of the SSB's. In other words, it was expected that MAT techniques could not be employed in biological materials because the Brownian motions, which cause metabolites to diffuse throughout the cells, would make it impossible to remove the susceptibility broadening with slow MAS. Indeed, it was shown that in a standard fast MAS experiment of water embedded in glass beads the spectral lines become broad even at spinning speeds of several hundred Hz (see Leu et al, *Amplitude Modulation and Relaxation Due to Diffusion in NMR Experiments With a Rotating Sample,* Chem Phys Lett 2000; 332:344–350), and that a sideband-suppression technique called total suppression of sidebands (TOSS) was ineffective for suppressing SSB's arising from water embedded in glass beads when the spinning speed was lowered to 1 kHz (see Liu et al, *Manipulation of Phase and Amplitude Modulation of Spin magnetization in Magic Angle Spinning NMR in the Presence of Molecular Diffusion*, J. Chem. Phys. 2001: 114: 5729–5734).

Another approach for increasing the sensitivity and resolution of NMR spectroscopy involves rotating the magnetic field rather than the sample. According to this approach the sample remains stationary. For example, Bradbury et al., *Nuclear Magnetic Resonance in a Rotating Magnetic Field*, Phys. Letters 1968; 26A: 405–406, disclose rotating the static magnetic field by superposing a static field and two sinusoidal fields in phase quadrature in the plane perpendicular to the static field and with amplitudes that are a factor $\sqrt{2}$ larger than that of the static component. However, this approach was never considered any further.

Thus, a need exists for a method for obtaining high resolution magnetic resonance analysis of biological objects.

In particular, there is a need for a magnetic resonance analysis technique that does not damage tissue or cell structure in biological objects and avoids the problems associated with SSBs at slow object spinning rates.

SUMMARY

Described herein are methods for magnetic resonance analysis of an object by combining slow magic angle spinning techniques with certain radio frequency pulse sequences. This combination provides for the first time a method for obtaining high resolution spectra of a biological object that (a) does not damage tissue or cellular structure in the biological object and (b) substantially eliminates spinning sideband peaks in the spectra associated with slow magic angle spinning. Contrary to the conventional expectation that the diffusion of the molecules containing the nuclei of interest in the internal static local magnetic fields would be problematic for slow spinning, the inventors have surprisingly discovered that the presently disclosed methods provide NMR spectra with a resolution comparable to or better than the spectral resolution obtained with conventional fast MAS, and that are substantially free of spinning sidebands peaks at low rotation frequencies.

In particular, according to a first embodiment there is provided a method of performing a magnetic resonance analysis of a biological object that includes placing the biological object in a main magnetic field and in a radio frequency field, the main magnetic field having a static field direction; rotating the biological object at a rotational frequency of less than about 100 Hz around an axis positioned at an angle of about 54°44' relative to the main magnetic static field direction; pulsing the radio frequency to provide a sequence that includes a magic angle turning pulse segment; and collecting data generated by the pulsed radio frequency.

According to a second embodiment there is provided a method of performing a magnetic resonance analysis of a biological object that includes placing the biological object in a main magnetic field and in a radio frequency field, the main magnetic field having a static field direction; rotating the biological object at a rotational frequency of less than about 100 Hz around an axis positioned at an angle of about 54°44' relative to the main magnetic static field direction; pulsing the radio frequency to provide a sequence capable of producing a spectrum that is substantially free of spinning sideband peaks; and collecting data generated by the pulsed radio frequency.

According to a third embodiment there is provided a method of performing a magnetic resonance analysis of a biological object that includes subjecting the biological object to a static magnetic field and a pulsed radio frequency field, the main magnetic field having a static field direction; rotating the biological object at a rotational frequency of less than about 100 Hz around an axis positioned at an angle of about 54°44' relative to the main magnetic static field direction; controlling the pulsed radio frequency to provide a sequence of pulses of radio frequency radiation capable of producing a spectrum that is substantially free of spinning sideband peaks; and generating a magnetic resonance analysis of the response by nuclei in the biological object to the pulsed radio frequency sequence.

According to a fourth embodiment there is provided a method of performing a magnetic resonance analysis of a biological object that includes placing the biological object in a main magnetic field and in a radio frequency field, the main magnetic field having a static field direction; positioning the object along a magic axis located at an angle of about 54°44' relative to the main magnetic static field direction; reorienting the object about the magic angle axis between three predetermined positions, the three predetermined positions being related to each other by 120°; pulsing the radio frequency to provide a sequence capable of producing a spectrum that is substantially free of anisotropic broadening (e.g., from magnetic susceptibility); and collecting data generated by the pulsed radio frequency.

According to a fifth embodiment there is provided a method of performing a magnetic resonance analysis of a biological object that includes providing a main magnetic field that includes a first component having a static field direction and an amplitude and a second and a third component, each second and third component having a sinusoidal field in a plane perpendicular to the static field direction of the first component and with an amplitude that is $2^{1/2}$ times the amplitude of the static field of the first component, wherein the second and third components produce a magnetic field that rotates in a plane perpendicular to the static field direction at a frequency of less than about 100 Hz resulting in an overall field that is rotating around an axis located at an angle of about 54°44' relative to the static field direction of the first component; placing the biological object in the main magnetic field and in a radio frequency field; pulsing the radio frequency to provide a pulse sequence capable of producing a spectrum that is substantially free of spinning sideband peaks; and collecting data generated by the pulsed radio frequency.

According to a sixth embodiment there is provided a method of performing a magnetic resonance analysis of a biological object that includes placing the biological object in a main magnetic field and in a radio frequency field, the main magnetic field having a static field direction; mechanically rotating a magnet around an axis at an angle of about 54°44' relative to the main magnetic static field direction at a rotational frequency of less than about 100 Hz; pulsing the radio frequency to provide a sequence capable of producing a spectrum that is substantially free of spinning sideband peaks; and collecting data generated by the pulsed radio frequency.

According to a seventh embodiment there is provided a method of performing a magnetic resonance analysis of a biological object that includes placing the biological object in a main magnetic field and in a radio frequency field, the main magnetic field having a static field direction; rotating the biological object at a rotational frequency of less than about 50 Hz around an axis positioned at a magic angle of about 54°44' relative to the main magnetic static field direction; rotating the main magnetic field at a rotational frequency of less than about 50 Hz around the magic angle axis such that the main magnetic field and the biological object rotate simultaneously in the opposite rotational direction; pulsing the radio frequency to provide a sequence capable of producing a spectrum that is substantially free of spinning sideband peaks; and collecting data generated by the pulsed radio frequency.

According to an eighth embodiment there is provided a method for performing a magnetic resonance imaging of a biological object that includes subjecting the biological object to a main magnetic field that has a static field direction, a pulsed radio frequency field, and at least one pulsed magnetic field gradient. The biological object is rotated at a rotational frequency of less than about 100 Hz around an axis positioned at an angle of about 54°44' relative to the main magnetic static field direction. The pulsed radio frequency is controlled to provide a pulse sequence that includes a magic angle turning pulse segment. The pulsed radio frequency and pulsed magnetic field gradient are also pulsed to generate spatially-selective nuclear magnetic resonance data. A magnetic resonance analysis of the response by nuclei in the biological object to the pulsed radio frequency sequence is generated.

It has been found that one particularly useful variant of the methods disclosed herein involves utilizing a pulse sequence that includes a 2D-phase-altered spinning sidebands (2D-PASS) pulse segment. Another particularly useful pulse segment is a phase-corrected magic angle turning (PHORMAT) pulse segment.

For in vitro investigations of small objects, the methods that include a 2D-PASS segment are especially useful for increasing the NMR sensitivity in a MRI experiment, and for increasing the sensitivity and resolution of NMR spectra of $^1H$ and other NMR-sensitive nuclei in MRS experiments in cells and intact excised tissues and organs. For in vivo investigations of larger biological objects, the methods that include a PHORMAT segment are especially useful for increasing the resolution of NMR spectra of $^1H$ and other NMR-sensitive nuclei in MRS experiments in live animals and humans. The slower rotating of the sample minimizes, if not substantially eliminates tissue and cellular damage. The presently disclosed methods have several important advantages over fast MAS: (I) larger rotors and, henceforth, larger samples can be used, which increases the NMR sensitivity (especially important when the method is applied for less NMR-sensitive nuclei than protons); (II) the structural integrity of the biological sample undergoes minimal or no changes under slow spinning (i.e., artifacts in the spectra induced by the fast spinning, which are a result of the sample deformation during the spinning, are avoided); and (III) besides the isotropic spectrum, the anisotropy patterns of the individual water and metabolite lines can be determined (allowing one to obtain information regarding the immediate surroundings of the various compounds).

BRIEF DESCRIPTION OF THE DRAWINGS

Certain embodiments will be described in more detail with reference to the following drawings:

FIGS. 5A, 5B and 5C show $^1H$ 2D-PASS spectra obtained by analyzing an excised intact mouse brain using one embodiment of the presently disclosed methods;

FIGS. 5D and 5E show $^1H$ spectra obtained by analyzing an excised intact mouse brain using prior art fast MAS;

FIGS. 6A, 6B and 6C show proton spectra of a stationary sample obtained by analyzing an excised intact mouse brain with a RF pulse sequence that did not include a water suppression segment;

FIGS. 7A–7H show proton spectra of different excised intact mouse organs and tissues obtained with 2D-PASS;

FIGS. 10A, 10B and 10C show $^1H$ spectra obtained by analyzing excised rat liver tissue using embodiments of the presently disclosed methods;

FIG. 10D shows $^1H$ spectra obtained by analyzing excised rat liver tissue using fast MAS;

FIGS. 14A–14E schematically represent embodiments of pulse sequences that combine MRI sequences with 2D-PASS sequences.

DETAILED DESCRIPTION OF SEVERAL EMBODIMENTS

Figure 1:
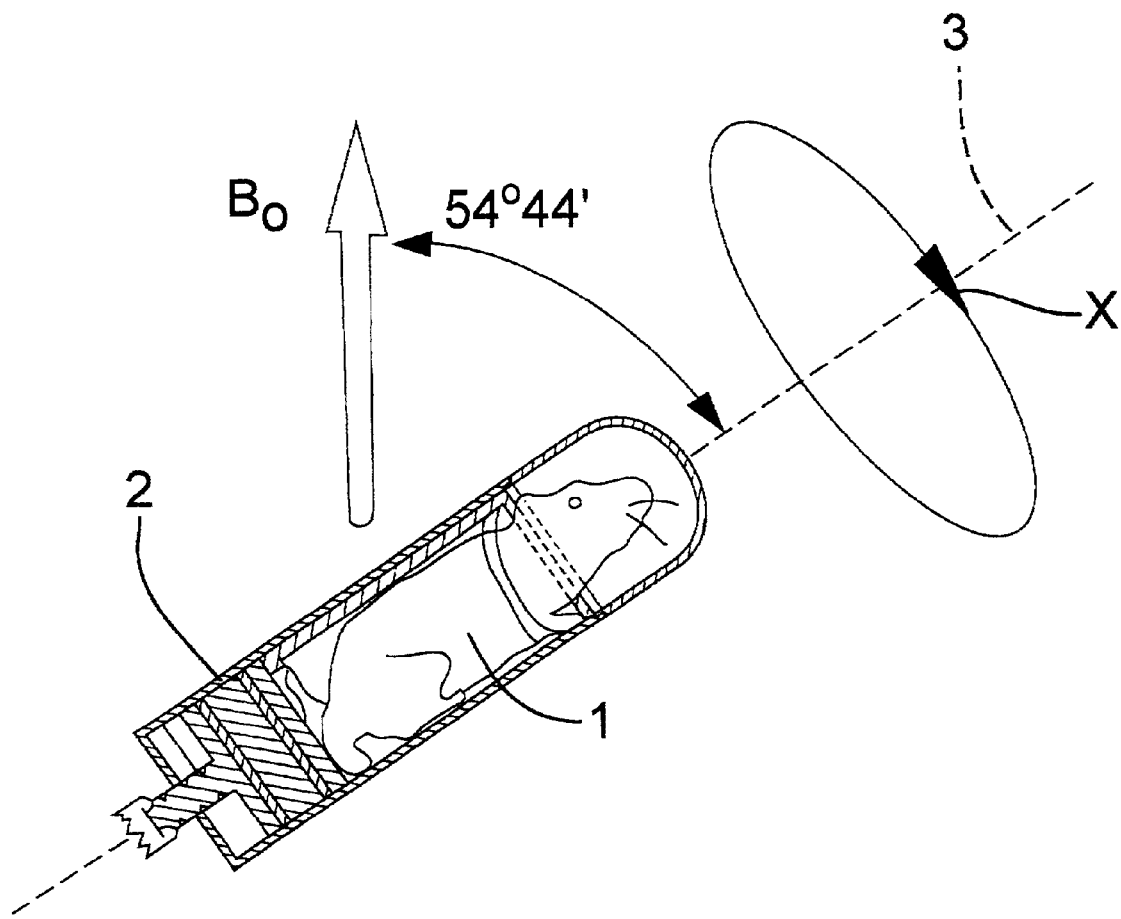
FIG. 1 is a perspective view of rotating a biological object at the magic angle relative to the main static magnetic field.

For ease of understanding, the following terms used herein are described below in more detail:

"Object" means a three-dimensional object such as an intact animal, an animal organ, a solid object such as an archaeological artifact, a spectrographic sample such as a tissue or cellular slice, a liquid non-biological material such as an organic compound or a solid material such as a metallic powder.

"Fluid object" means an object that includes a substantial amount of fluid (such as greater than about 60 weight %.), as opposed to a solid object. A typical example of a fluid object is an intact human or a human organ that typically includes at least about 80 weight % water.

"Biological object" means any object, usually a fluid object, that includes cellular matter. Exemplary biological objects include cell systems, excised tissues and intact organs, live animals, and human patients.

"Main magnet" or "main magnetic field" denotes the magnet that generates the static magnetic field (typically referred to as $B_0$ or $H_0$) as known in the art. The main magnetic field is distinguished from the RF magnetic field used to induce excitation of the atomic nuclei or the RF magnetic gradient field used in magnetic resonance. Of course, MRS and MRI tools that could be used with the described method include a main magnet capable of producing the static and homogeneous main magnetic field. Such magnets are well known and typically are superconducting magnets.

The above definitions are provided solely to aid the reader, and should not be construed to have a scope less than that understood by a person of ordinary skill in the art or as limiting the scope of the appended claims.

Magic angle spinning is based on exposing the object to a partially time-dependent external magnetic field rather than the static magnetic field $B_0$ currently used. Specifically, the magnetic field consists of a static component with amplitude $B_0/\sqrt{3}$, and a component of amplitude $B_0\sqrt{2/3}$, rotating in a plane perpendicular to the static field component.

In accordance with the first, second and third above-identified embodiments the slow magic angle spinning involves spinning or rotating the object at a frequency of less than about 100 Hz, preferably less than about 10 Hz, and more preferably less than about 3 Hz. An example of a range of possible rotating frequencies is about 1 to about 100 Hz, preferably about 1 to about 5 Hz. In contrast, standard fast magic angle spinning employs frequencies on the order of at least one kHz.

In accordance with the fourth above-identified embodiment the object is "hopped" over angles of 120° around the magic axis rather than continuously rotated. The time to complete one full rotation corresponds to the rotation times when spinning continuously (e.g., as in the first, second and third embodiments) at a frequency of less than about 100 Hz, preferably less than about 10 Hz, and more preferably less than about 3 Hz.

In accordance with the fifth above-identified embodiment both the magnet and the biological object remain stationary, and part of the magnetic field is rendered electronically time dependent such that the overall magnetic field is rotated around the magic axis with respect to the direction of the overall magnetic field at a frequency of less than about 100 Hz, preferably less than about 10 Hz, and more preferably less than about 3 Hz. An example of a range of possible rotating frequencies is about 1 to about 100 Hz, preferably about 1 to about 5 Hz.

In accordance with the sixth above-identified embodiment the biological object remains stationary, and the magnet is physically rotated around the magic angle with respect to the direction of the main magnetic field at a frequency of less than about 100 Hz, preferably less than about 10 Hz, and more preferably less than about 3 Hz. An example of a range of possible rotating frequencies is about 1 to about 100 Hz, preferably about 1 to about 5 Hz.

In accordance with the seventh above-identified embodiment both the biological object and the magnetic field are rotated in opposite directions, each at a frequency of less than about 50 Hz, preferably less than about 3 Hz, and more preferably less than about 2 Hz. An example of a range of possible rotating frequencies is about 0.5 to about 50 Hz, preferably about 0.5 to about 2 Hz.

An example of a configuration for rotating the object while the main static magnetic field is stationary is shown in FIG. 1. A biological object 1 is placed in a sample holder 2 that is rotatable about an axis 3 in a direction X placed in a static magnetic field generated by a main magnet (not shown) in a MRS or MRI tool. Axis 3 is located at an angle of 54°44' relative to the direction of the static magnetic field $B_0$. MRS (e.g., NMR) and MRI apparatus capable of rotating an object or sample for MAS are well known (see e.g., U.S. Pat. No. 4,511,841). Commercially available NMR tools that have rotors for spinning a sample include those probes available from Varian/Chemagnetics, Inc. (Ft. Collins, Colo.) or Bruker Instruments, Inc. (Billerica, Mass.).

Figure 12:
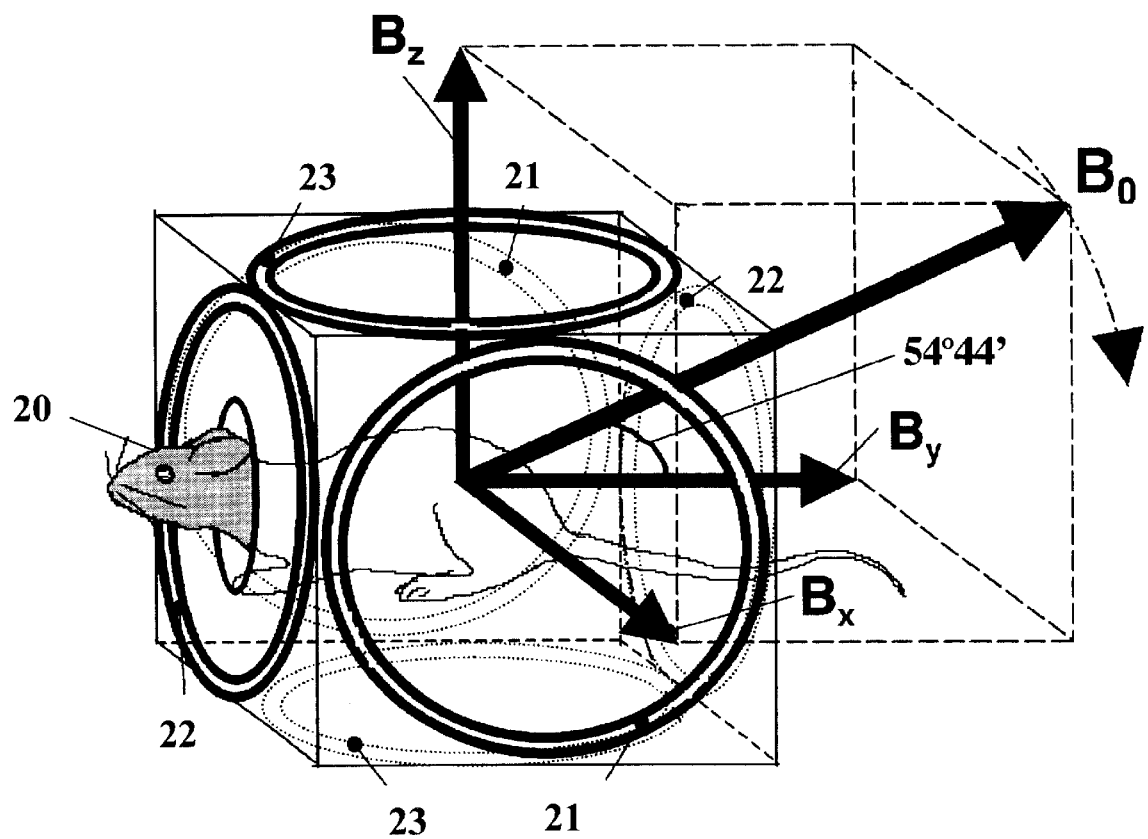
FIG. 12 is a schematic representation of a RF coil configuration for electronically rotating the magnetic field.

An example of a magnet configuration for electronically rotating the magnetic field while the biological object is held stationary per the above-described fifth embodiment is shown in FIG. 12. A complementary pair of first RF coils 21 are arranged to generate an alternating magnetic field $B_x$ in the x-direction, given by $$B_x = \sqrt{2/3} \cdot B_0 \cdot \sin(\omega_r t).$$

A complementary pair of second RF coils 22 are arranged to generate a static magnetic field $B_y$ in the y-direction, given by $$B_y = B_0/\sqrt{3}.$$

A complementary pair of third RF coils 23 are arranged to generate an alternating magnetic field $$B_z = \sqrt{2/3} \cdot B_0 \cdot \cos(\omega_r t).$$

DC and AC currents passing through each set of coils 21, 22, 23 produce three mutually orthogonal magnetic field components. A biological object 20 is placed in the center of the coil system. As a result, the overall magnetic field is given by $B_0$, which rotates around an axis making the magic angle of 54°44' relative to the static component $B_y$.

Figure 13:
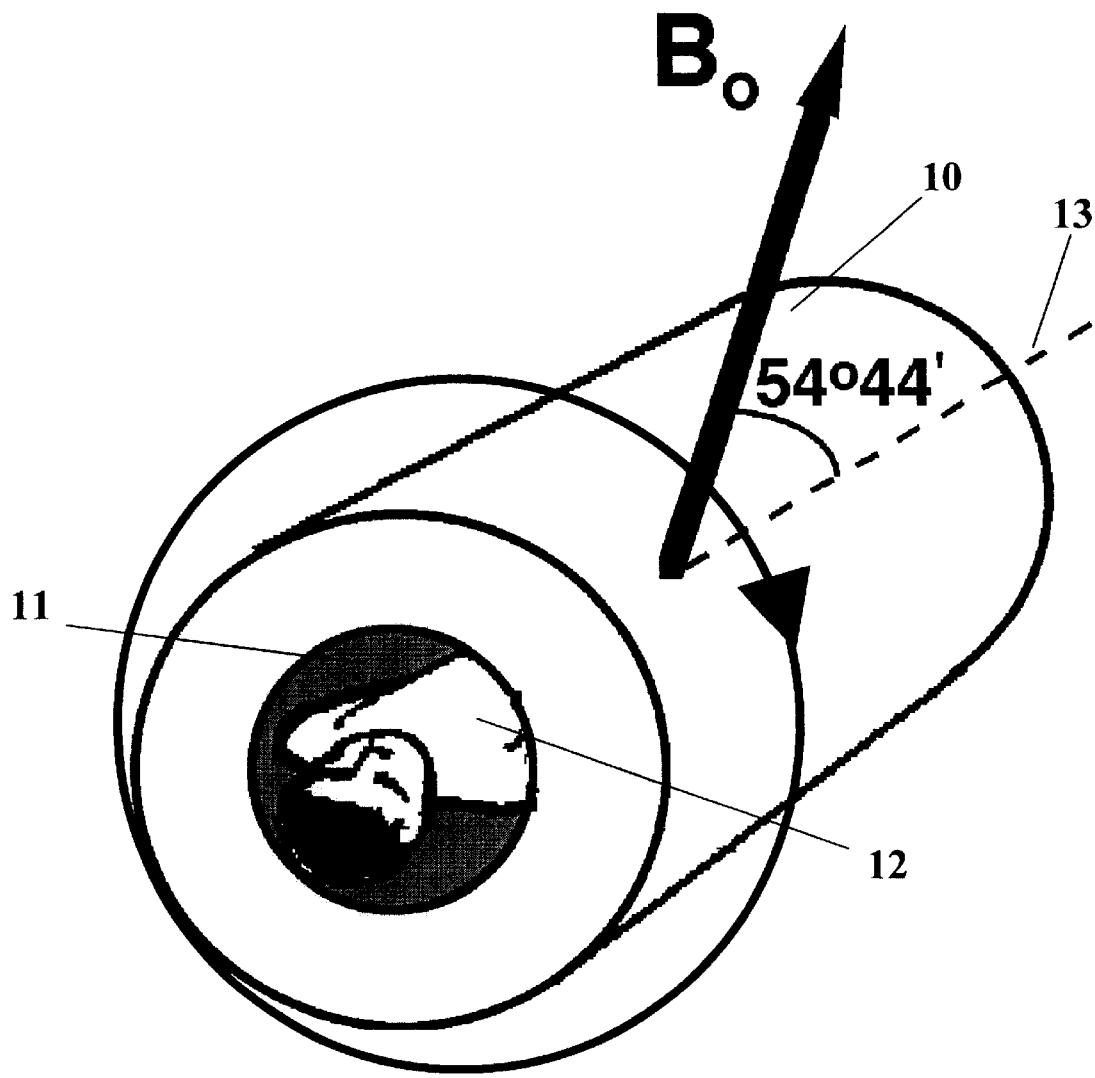
FIG. 13 is a schematic representation of a device that holds the biological object stationary and mechanically rotates the magnetic field.

An example of a configuration for physically rotating the magnet while the biological object is held stationary per the above-described sixth embodiment is shown in FIG. 13. A magnet bore 10 defines a void 11 for receiving a biological object (e.g., a human) 12 and a longitudinal axis 13. The longitudinal axis 13 of the magnet bore 10 is aligned at the magic angle of 54°44' relative to the direction of the main magnetic field $B_0$. The main magnetic field $B_0$ is generated by the magnet bore 10. The magnet bore 10 may be rotated mechanically around the longitudinal axis 13 as shown by the directional arrow in FIG. 13.

The above-described seventh embodiment involves rotating both the biological object and the main magnetic field in respectively opposite rotational directions. For example, the device depicted in FIG. 12 or FIG. 13 could be modified so that the biological object also rotates. Such rotation allows for the rotational frequency of both the biological object and the main magnetic field to decrease by a factor of two.

The RF pulse sequence employed in the presently disclosed methods may be any sequence or series of sequences capable of producing a high-resolution spectrum in a slow MAS approach that is substantially free of spinning sidebands. The RF pulse sequences can be repeated during every rotor period (i.e., one 360° rotation of the object) throughout the duration of the scanning. A typical characteristic of these RF pulse sequences may be isotropic-anisotropic chemical shift correlation pulse sequences. Exemplary RF pulse sequences include MAT sequences. These RF pulse sequences preferably can be applied synchronously with the spinning of the object. A combination of RF pulse sequences that each have a different function may be used.

One example of a MAT technique that could be used in the disclosed methods involves continuously rotating the biological object and applying five RF π pulses during a constant evolution time period (e.g., one rotor period). A π pulse rotates the magnetization over 180°.

Figure 2:
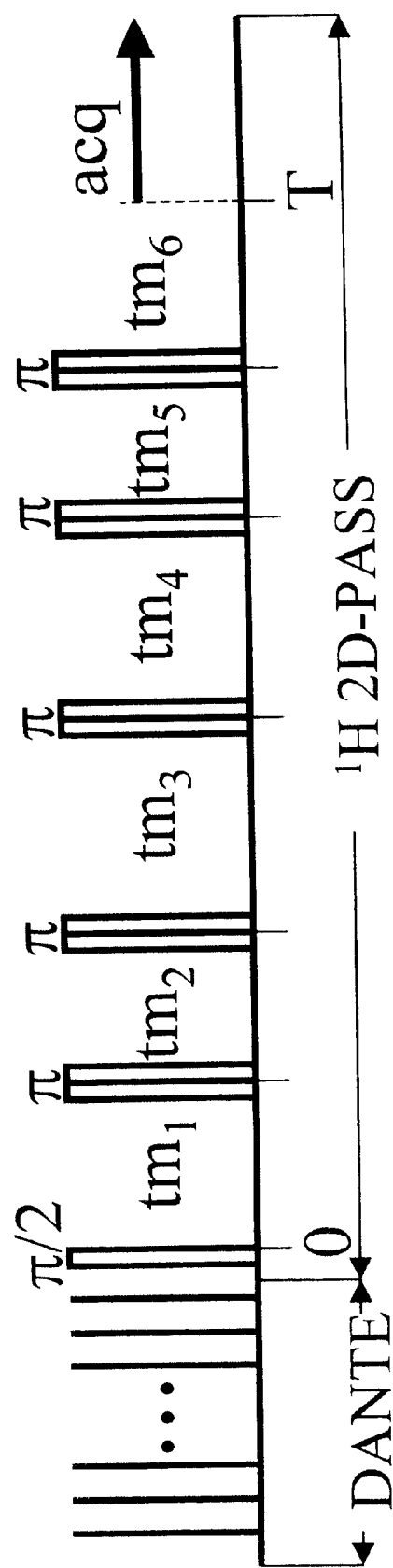
FIG. 2 represents one embodiment of a 2D-PASS RF pulse sequence in accordance with the presently disclosed methods.

An illustrative five RF π it pulses technique is the five π it replicated magic angle turning (FIREMAT) as described, for example, in Hu et al., *An Isotropic Chemical Shift-Chemical Shift Anisotropy Magic Angle Slow-Spinning 2D NMR Experiment,* J. Magn. Reson. 1993; A 105: 82–87; and Alderman et al., *A Sensitive, High Resolution Magic Angle Turning Experiment for Measuring Chemical Shift Tensor Principal Values,* Molecular Physics 1998; 95(6): 1113–1126. Another illustrative five RF it pulses technique is the 2D-phase-altered spinning sidebands (PASS) technique as described, for example, in Antzutkin et al., *Two-Dimensional Sideband Separation in Magic-Angle-Spinning NMR,*. J. Magn. Reson 1995; A115: 7–19). One variant of a 2D-PASS segment is shown in FIG. 2. All of these experiments are 2D isotropic-anisotropic chemical shift correlation experiments yielding a high resolution isotropic chemical shift dimension and a chemical shift anisotropy dimension.

A further example of a particularly useful MAT technique is known as phase-corrected magic angle turning (PHORMAT) as described, for example, in Hu et al., *Magic-Angle-Turning Experiments for Measuring Chemical-Shift-Tensor Principal Values in Powdered Solids*, J. Magn. Reson. 1995: A 113: 210–222 and Hu et al., Magic Angle Turning and Hopping, in Encyclopedia of Magnetic Resonance, D. M. Grant and R. K. Harris, Eds. New York: John Wiley & Sons: 1996, 2914–2921. Similar to 2D-PASS, PHORMAT involves continuously rotating the object with RF pulses spaced at one-third of the rotor period in order to obtain an isotropic shift evolution. According to the PHORMAT technique, echo pulses are incorporated into the pulse sequence in such a way that the magnetization refocuses exactly, despite the modulation of the chemical shift by the rotation of the sample. In particular, two pulse sequences are employed that are derived from a combination of mixed-amplitude-phase-modulated and triple-echo sequences. These sequences have the effect of converting phase modulation to amplitude modulation, creating the equivalent of positive and negative evolution times by placing the 180° echo pulses either before or after the three phase-accumulating periods.

With either PASS or PHORMAT the isotropic peak can be separated from the SSB's at all spinning speeds, and the linewidth is substantially narrowed even at a spinning speed as low as about 1 Hz.

In PASS the magnetization is constantly present in the transverse plane, and the first signal is observed after one rotor period. The amplitude of the signal may be reduced as a result of the decay of the magnetization during this period, which is governed by the spin-spin relaxation time $T_2$. Therefore, signal attenuation may occur when the spinning rate is comparable to or less than $(T_2)^{-1}$.

In PHORMAT the magnetization is stored longitudinally along the main field direction with a maximum duration of ⅔ times the rotor period. Consequently, the spinning frequency has to be large compared with the spin-lattice relaxation rate $(T_1)^{-1}$ of the spins in order to avoid signal attenuation. Lower MAS frequencies can be used with PHORMAT relative to PASS since $(T_1)^{-1}$ is usually an order of magnitude smaller than $(T_2)^{-1}$ in biological objects For example, PASS is particularly useful for spinning frequencies of greater than about 10 Hz, especially at least about 20 Hz, and PHORMAT is particularly useful for spinning frequencies of less than about 10 Hz (e.g., about 1 Hz to 50 Hz). A further distinction between PHORMAT and PASS is that the measuring time of a PASS analysis can take only a few minutes, but the measuring time of a PHORMAT analysis can take up to one hour or more. Yet another distinction between PHORMAT and PASS is that in a PHORMAT experiment the NMR sensitivity is reduced by at least an inherent factor 4 relative to PASS.

Another RF pulse sequence that is useful in the presently detailed methods is a water suppression segment that suppresses residual SSBs caused by water in a biological object. The water suppression pulse sequence may be used for analysis of metabolite spectra. Without water suppression these metabolite spectra would be polluted by artificial lines arising from residual SSBs of the water. Of course, water suppression is not used when it is desired to investigate the water peak or signal of a biological object. An exemplary water suppression segment is a DANTE pulse sequence as described, for example, in Morris et al., *Selective Excitation in Fourier Transform Nuclear Magnetic Resonance*, J. Magn. Reson., 1978; 29:433–462. Another possible water suppression sequence is the known combination of a shaped pulse segment and a pulsed field gradient segment as described in Chen et al., *Biochemical Analysis Using High-Resolution Magic Angle Spinning NMR Spectroscopy Distinguishes Lipoma-like Well-differentiated Liposarcoma from Normal Fat*, J. Am. Chem Soc. 2001; 123:9200–9201.

According to an example of the presently disclosed methods, the RF pulse sequence includes a DANTE pulse sequence segment followed by a 2D-PASS sequence segment as shown in FIG. 2. In this instance, the cross-polarization component described in Antzutkin et al., *Two-Dimensional Sideband Separation in Magic-Angle-Spinning NMR*, was replaced by a π/2 pulse to rotate the magnetization in a plane perpendicular to that of $B_0$. In a 2D-PASS spectrum, the sidebands typically are separated by the order n of the SSB. The center-band spectrum, where n=0, displays a SSB-free spectrum, whereas the other spectra show the SSB spectra in increasing order. By shifting the sideband spectra by n times the spinning frequency and adding them all together, an isotropic spectrum may be obtained. As was explained in Antzutkin et al., *Two-Dimensional Sideband Separation in Magic-Angle-Spinning NMR*, an intrinsic $T_2$ weighting of one rotor period can be introduced in 2D-PASS. In order to compensate for pulse imperfections and RF field inhomogeneity, a phase cycling sequence may be applied. A preferred phase cycle consists of about 96 steps, and is substantially the same as originally developed for the FIREMAT experiment (see Alderman et al., *A Sensitive, High Resolution Magic Angle Turning Experiment for Measuring Chemical Shift Tensor Principal Values*). It has been found that fewer phase steps could be used in the invention without major spectral distortions. The timings $tm_1$–$tm_6$ between the six pulses may be determined by the so-called PASS-16 sequence given in Antzutkin et al., *Two-Dimensional Sideband Separation in Magic-Angle-Spinning NMR*. Sixteen different combinations of delay times $tm_1$–$tm_6$ were used (to be called evolution increments hereafter), which makes it possible to separate the center-band and 15 sideband spectra without spectral aliasing. The width of the π pulse varies typically on the order of tens of microseconds to a millisecond, depending on the type and the amount of tissue loaded into the rotor. In FIG. 2 time point "T" denotes the end of a rotor period, time point "0" denotes the start of a rotor period and "acq" denotes acquisition of the NMR signal. The timings were counted from the middle of the it pulses. Two extra data points were acquired at the beginning of the acquisition dimension to account for the dead time effect associated with probe ring down and receiver recovery, which were not included in the Fourier transformation. Fourier transformation using only 16 points along the evolution dimension was applied.

Figure 8:
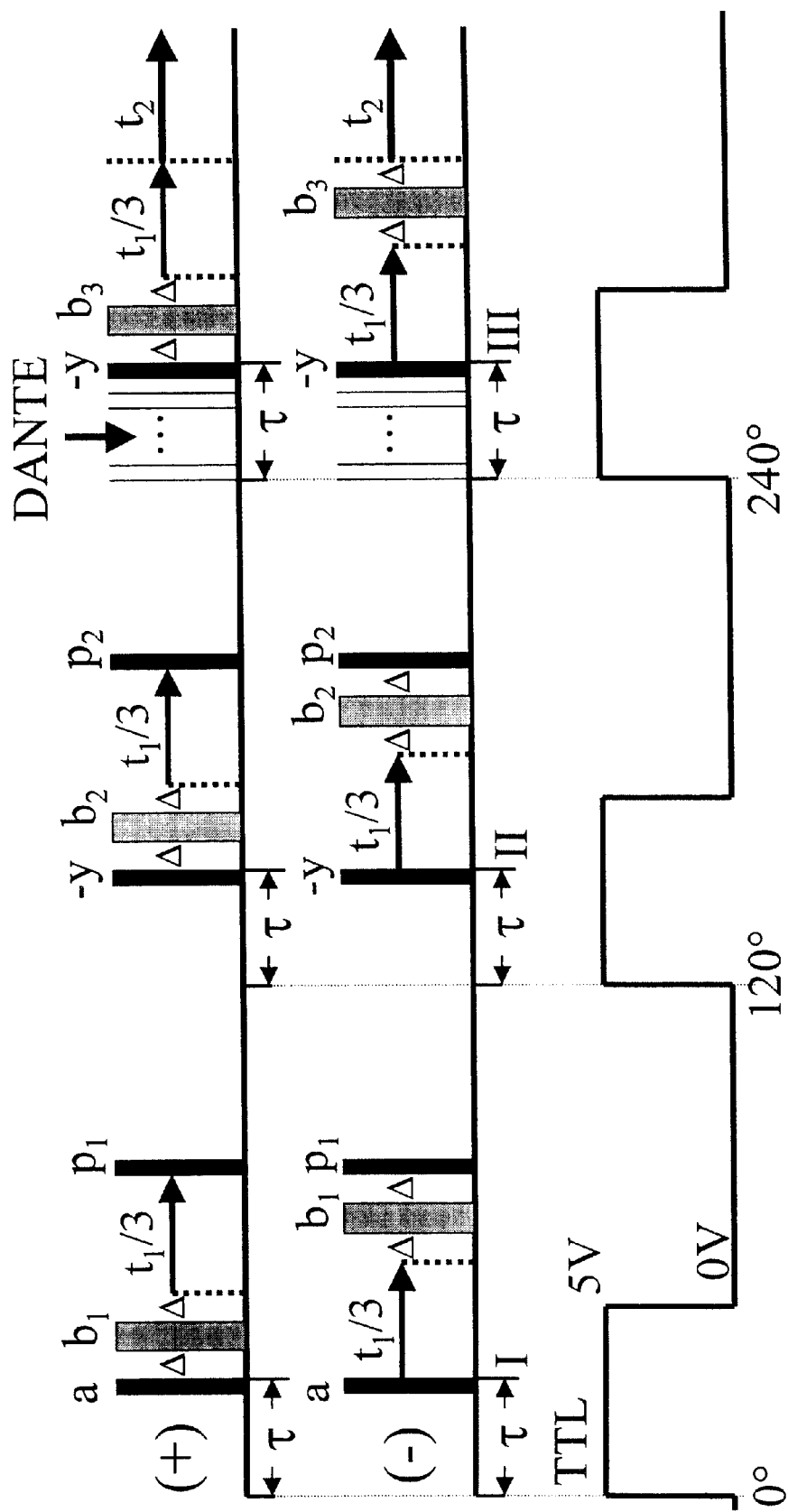
FIG. 8 represents a further embodiment of a RF pulse sequence (PHORMAT) in accordance with the presently disclosed methods.

According to another example of the presently disclosed methods, the RF pulse sequence includes a modified PHORMAT sequence as depicted in FIG. 8. The 90° pulses labeled (I), (II) and (III) are synchronized to ⅓ of the rotor cycle by marking the rotor evenly with three precision marks that are mutually 120° apart. An optical detector is used to generate transistor-to-transistor logic (TTL) pulses associated with these markers, which serve as trigger pulses for the RF pulse sequences. The presence of the markers means that the spinning speed has to be stable only for a short period of time, i.e., during one rotor period. The position of the rotor with respect to the external field may differ by 0°, 120° or 240° at the beginning of each evolution increment. In the case of an anisotropic object, such rotor positioning may create distortions in the spectra as well as a loss in sensitivity. This issue could be overcome by putting a single extra marker on the rotor and using a second optical generator to generate a TTL pulse associated with this marker to trigger the beginning of a PHORMAT sequence.

A 90° pulse (I) is substituted for the cross-polarization component to rotate the magnetization in a plane perpendicular to that of $B_0$. A DANTE pulse sequence segment was employed immediately before the last pulse (III) to suppress the water signal. The DANTE pulse sequence was inserted by switching the carrier frequency to the center of the water peak prior to the start of the DANTE sequence and then switching this frequency back to its original value at the end of the DANTE segment. The first two 90° pulses (I) and (II) are delayed by the time τ of the DANTE segment applied before the third readout pulse (III). This delay is instituted to separate the three read pulses (I, II, and III) by exactly ⅓ of the rotor period.

In FIG. 8 the 90° pulses are denoted in black and the 180° pulses are denoted in gray. The phase cycling for the initial 90° pulse labeled by "a" is (−y, +y) while the phase cycles for the rest of the pulses ($p_1$, $p_2$, $b_1$, $b_2$ and $b_3$) are the same as those described in Hu et al., *Magic-Angle-Turning Experiments for Measuring Chemical-Shift-Tensor Principal Values in Powdered Solids*, J. Magn. Reson. 1995: A 113: 210–222. The parameter A denotes half of the echo time. The use of 180° pulses, placed before (+) of after (−) the three phase accumulation periods significantly improves the base plane of the 2D spectra and produces a spinning sideband-free isotropic spectrum directly as a projection onto the evolution axis without shearing. The time variables $t_1$ and $t_2$ correspond to the evolution and acquisition dimension, respectively. The bottom trace is the TTL signal generated by the optical sensor of the MAS probe.

Alternative methods for water suppression employing pulsed field gradients can be used that significantly shorten the τ values (see Chen et al., *Biochemical Analysis Using High-Resolution Magic Angle Spinning NMR Spectroscopy Distinguishes Lipoma-like Well-differentiated Liposarcoma from Normal Fat*, J. Am. Chem Soc. 2001; 123:9200–9201) so that a higher spinning rate can be achieved with a PHORMAT sequence.

The fourth embodiment mentioned above in the Summary utilizes a technique generally known in the art as magic angle hopping (MAH). In particular, the object is quickly reoriented (i.e., "hopped") about the magic angle axis between three predetermined positions being related to each other by 120°. One methodology for accomplishing this reorientation is to hop or rotate the biological object three times (e.g., 0–120 degrees, 120–240 degrees and 240–0 degrees, or 0–120 degrees, 120–240 degrees and 240–360 degrees) about an axis at the magic angle. The RF frequency may be pulsed to produce a high-resolution spectrum that is substantially free of line broadening caused by the bulk magnetic susceptibility and the residual chemical shift interaction. Illustrative MAH techniques and the accompanying RF pulse sequences are described, for example, in Bax et al., *Correlation of Isotropic Shifts and Chemical Shift Anisotropies by Two-Dimensional Fourier-Transform Magic-Angle Hopping NMR Spectroscopy*, J. Magn. Reson. 1983; 52: 147; Hu et al., *Improving the Magic Angle Hopping Experiment*, Solid State NMR, 2, 235–243 (1993); and Hu et al., *Magic Angle Turning and Hopping*, in Encyclopedia of Magnetic Resonance D. M. Grant, and R. K. Harris, Eds. New York: John Wiley & Sons: 1996, 2914–2921. A water suppression RF pulse sequence as described above could also be used in connection with MAH techniques.

The fifth embodiment mentioned above in the Summary utilizes a rotating magnetic field that is a superposition of a static field and two orthogonal sinusoidal fields in phase quadrature in the plane perpendicular to the static field and with amplitudes that are a factor $2^{1/2}$ larger than that of the static component. In particular, three RF coil configurations are used to produce magnetic fields in three mutually perpendicular directions. Applying a stationary current to one of the coils and quadrature sinusoidal AC currents to the other two coils electronically generates a rotating magnetic field. A magnetic field component is generated that is rotated in a plane perpendicular to the direction the static field component and with an amplitude that is $2^{1/2}$ times the amplitude of the static field component. The resulting overall magnetic field rotates at a frequency of about 1 to about 100 Hz, preferably about 1 to about 10 Hz, with the angle between the static field direction and the direction of the overall rotating magnetic field being about 54°44'. In other words, a magnetic field is created that rotates relative to a stationary object. Furthermore, by making the amplitude of the sinusoidal fields $2^{1/2}$ times larger than the stationary or static field, the resulting magnetic field rotates at the required magic angle.

The eighth embodiment described above in the Summary relates to MRI (including localized MRS) methods that may be enhanced by utilizing the slow magic angle turning techniques disclosed herein. In this instance, the biological object is also subjected to pulsed magnetic fields that can produce gradients in the main magnetic field in the X, Y and Z directions. This method provides the ability of obtaining nuclear magnetic resonance data concerning a specific predetermined region or space of the biological object rather than the whole object.

One example of combining MAT with MRI involves applying a MAT sequence as described above to a biological object rotating around the magic axis to obtain a NMR spectrum by generating magnetic field gradients rotating synchronously with the object and preceding the MAT sequence with volume selective RF and gradient pulses such as point resolved surface spectroscopy (PRESS) (see Bryant et al., *Spatial Localization Techniques for Human MRS*, Biomedical Magnetic Resonance Imaging and Spectroscopy (Young, ed. Wiley, New York, pp. 785–791 (2000)). U.S. Pat. No. 4,301,410 describes a system and process for generating magnetic field gradients that rotate synchronously with an object. Specific illustrations of combining MRI sequences with slow MAT sequences are depicted in FIGS. 14A–14E and 15. FIGS. 14A–14E show various examples of imaging pulse sequence combined with a PASS sequence. FIGS. 15A and 15B show pulse sequences that include a PHORMAT sequence.

Figure 14A:
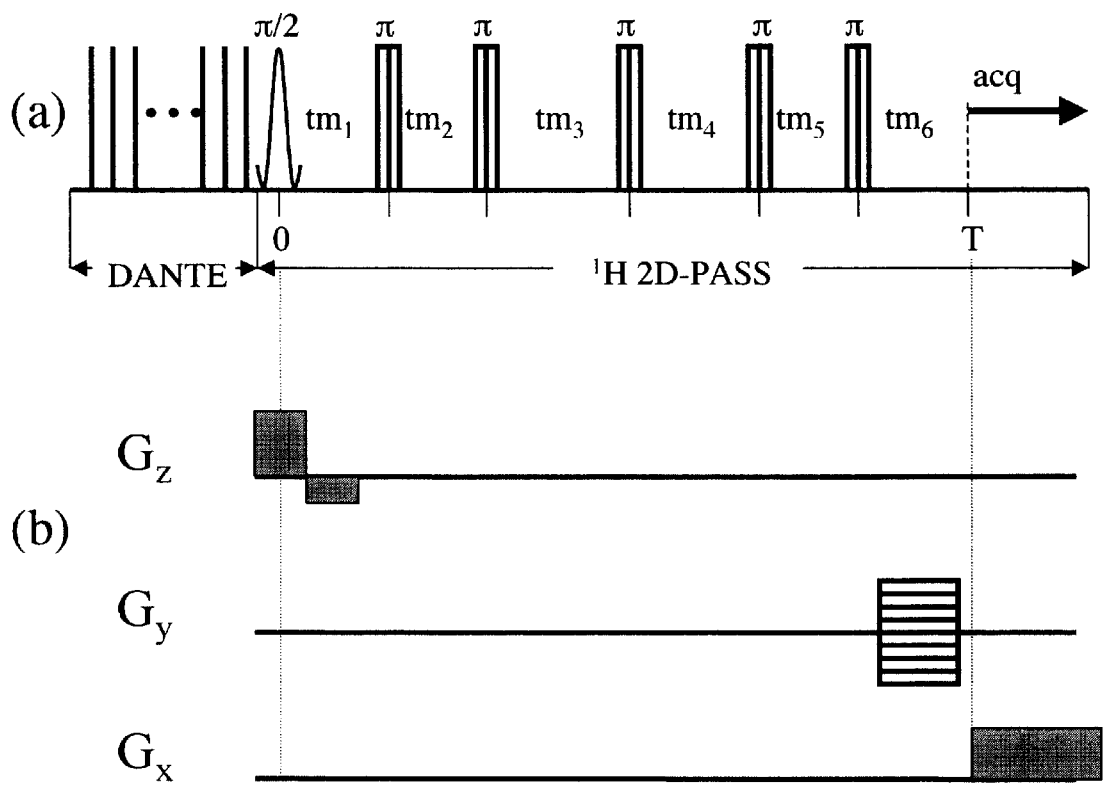
Figure 15A:
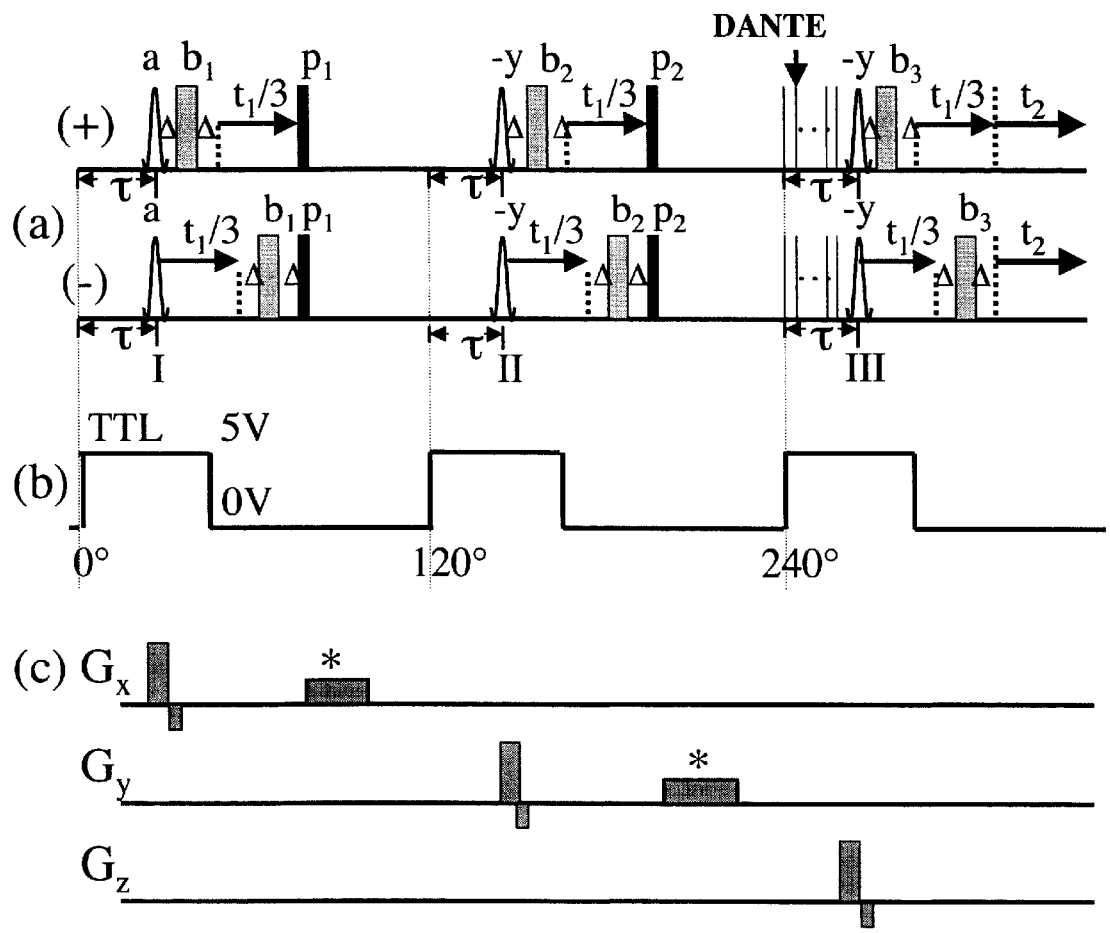
FIGS. 15A and 15B schematically represent embodiments of pulse sequences that combine MRI sequences and PHORMAT sequences.
Figure 15B:
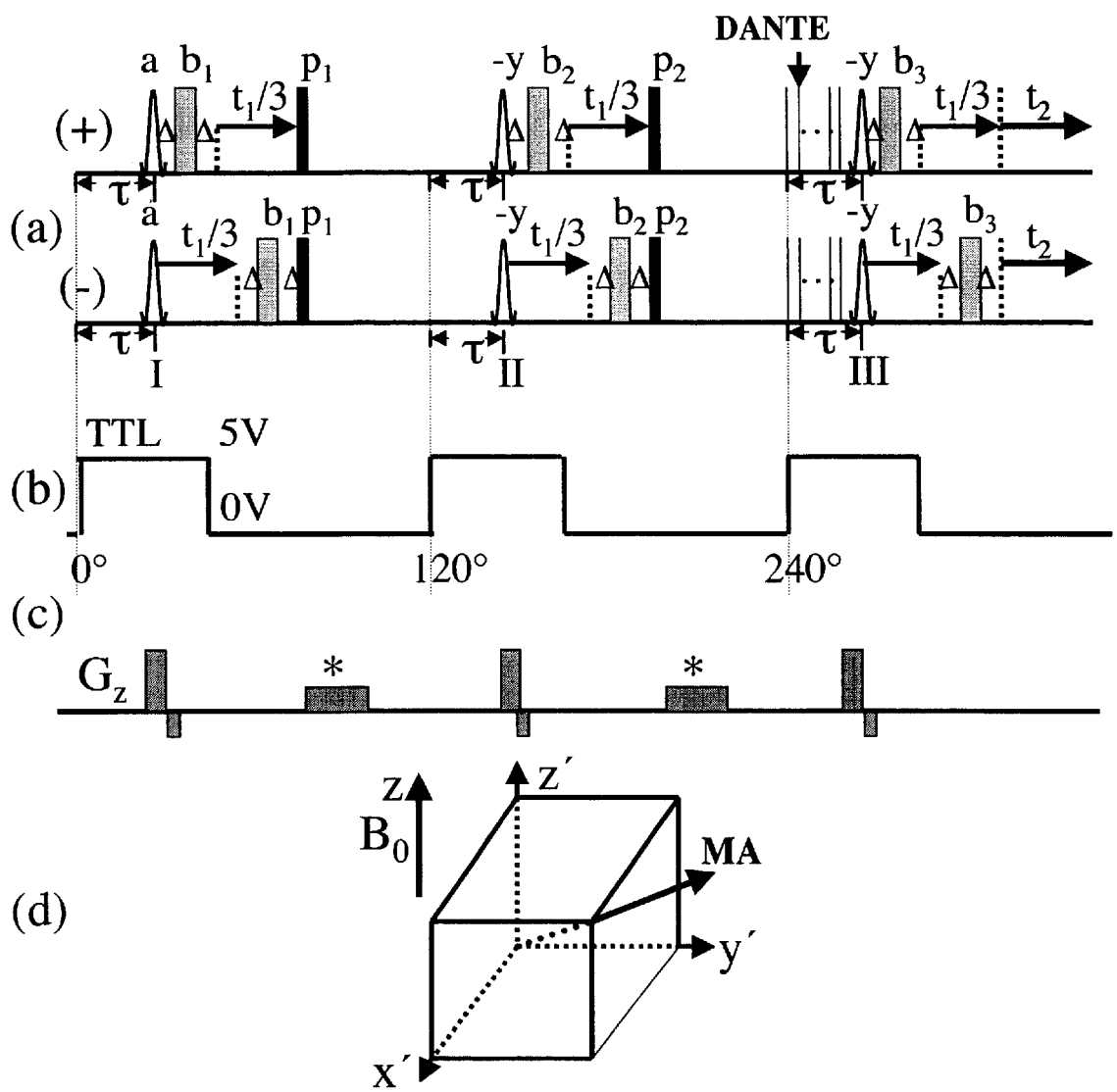

FIG. 14A shows a 2D imaging pulse sequence combined with a PASS sequence. The π/2 pulse is a sinc selective pulse applied in the presence of the gradient Gz. Gradients Gx, Gy and Gz are rotating synchronously with the sample rotation so that in the sample frame the gradients are static. The gradient coils themselves are not required to rotate since the rotating gradients may be obtained electronically with ac currents through the coils, similar to the way a rotating $B_0$ field is produced electronically. Gz is the slice selection gradient along the rotor axis. Gx is the readout gradient along the rotor x axis. Gy is the phase encoding gradient along the rotor y axis. For water suppression, a CHESS sequence (Haase et al., $^1$HNMR Chemical Shift Selective (CHESS) Imaging, Phys. Med. Biol. 1985; 30:341–344; Dreher et al., Changes in Apparent Diffusion Coefficients of Metabolites in Rat Brain After Middle Cerebral Artery Occlusion Measured by Proton Magnetic Resonance Spectroscopy, Magn. Reson. Med. 2001; 45:383–389 can be used to replace the DANTE segment.

Figure 14B:
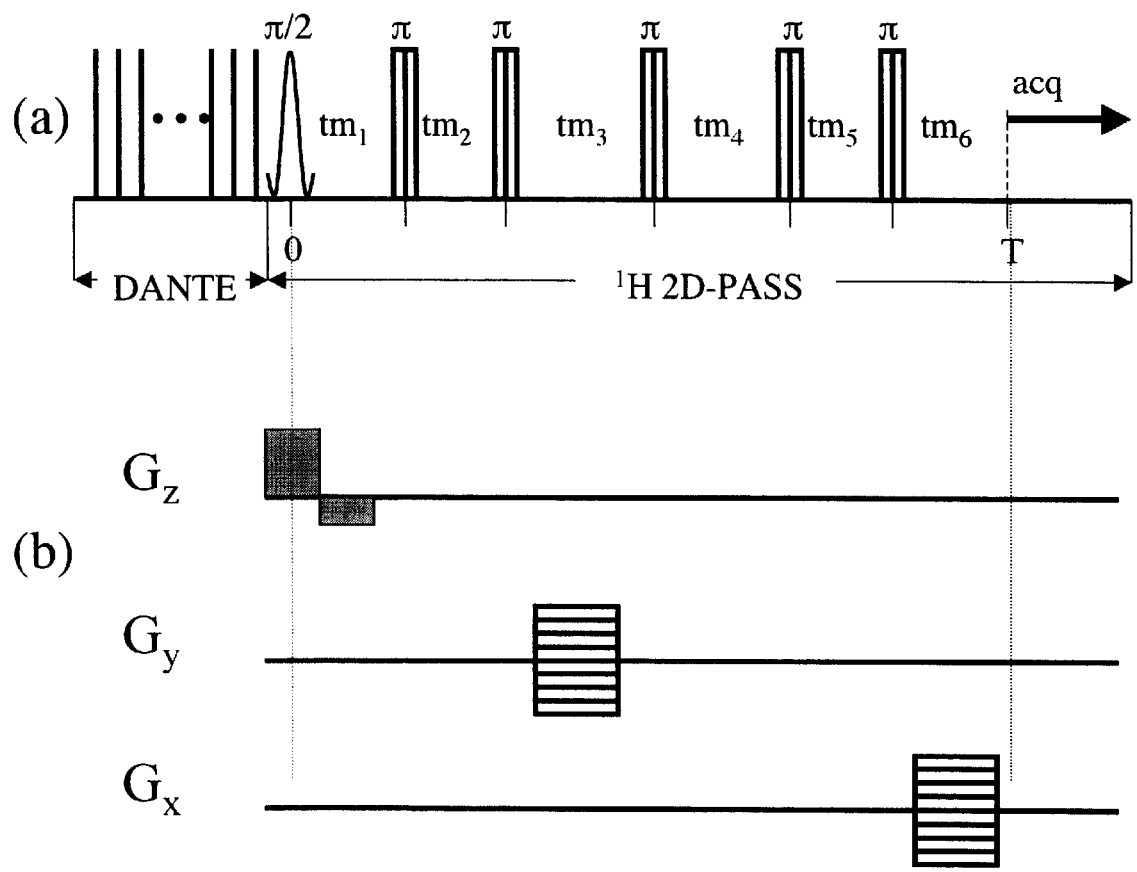

FIG. 14B depicts a 2D chemical shift imaging pulse sequence utilizing a PASS sequence. The only difference with the 2D-MRI-PASS sequence shown in FIG. 14A is that the readout gradient Gx is replaced by a phase-encoding gradient in the same direction.

Figure 14C:
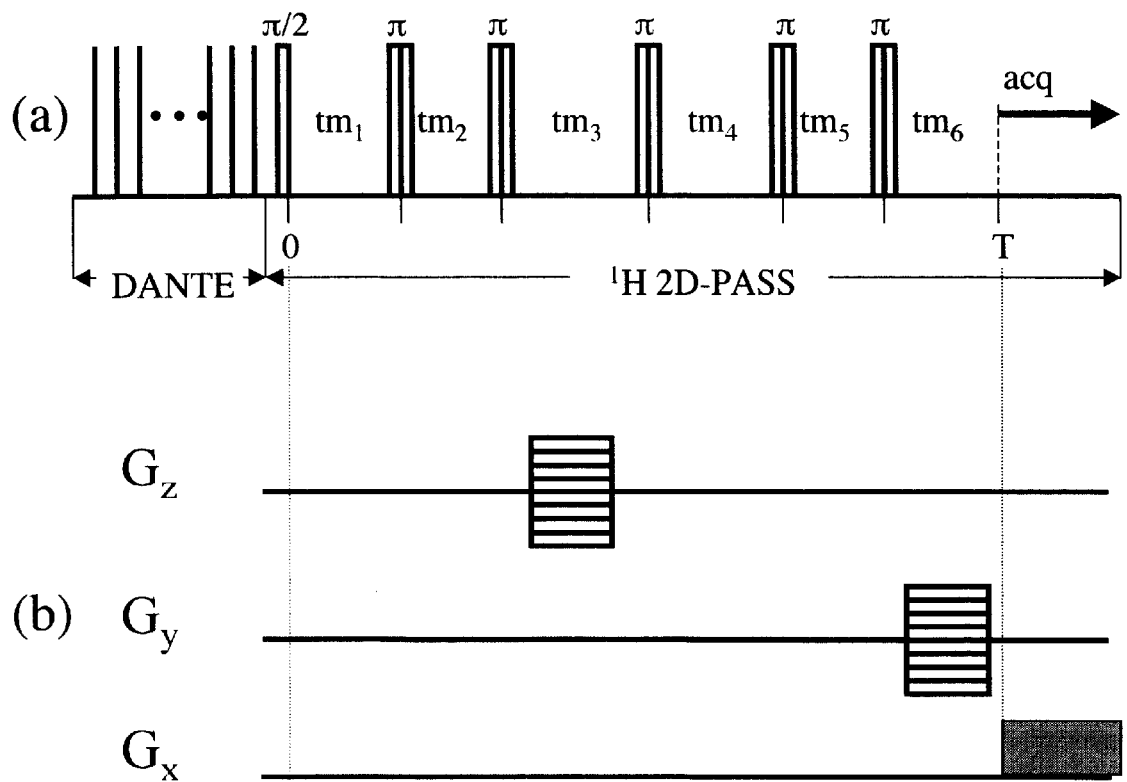

FIG. 14C shows an example of a 3D imaging pulse sequence combined with the PASS method. Gradients Gx, Gy and Gz are rotating synchronously with sample rotation so that in the sample frame the gradients are static as described above in connection with FIG. 14A. Gz is the phase encoding gradient along the rotating axis, Gy is the phase encoding gradient along the rotor y axis, and Gx is the readout gradient along the rotor x axis. For water suppression, a CHESS sequence can be used to replace the DANTE segment.

Figure 14D:
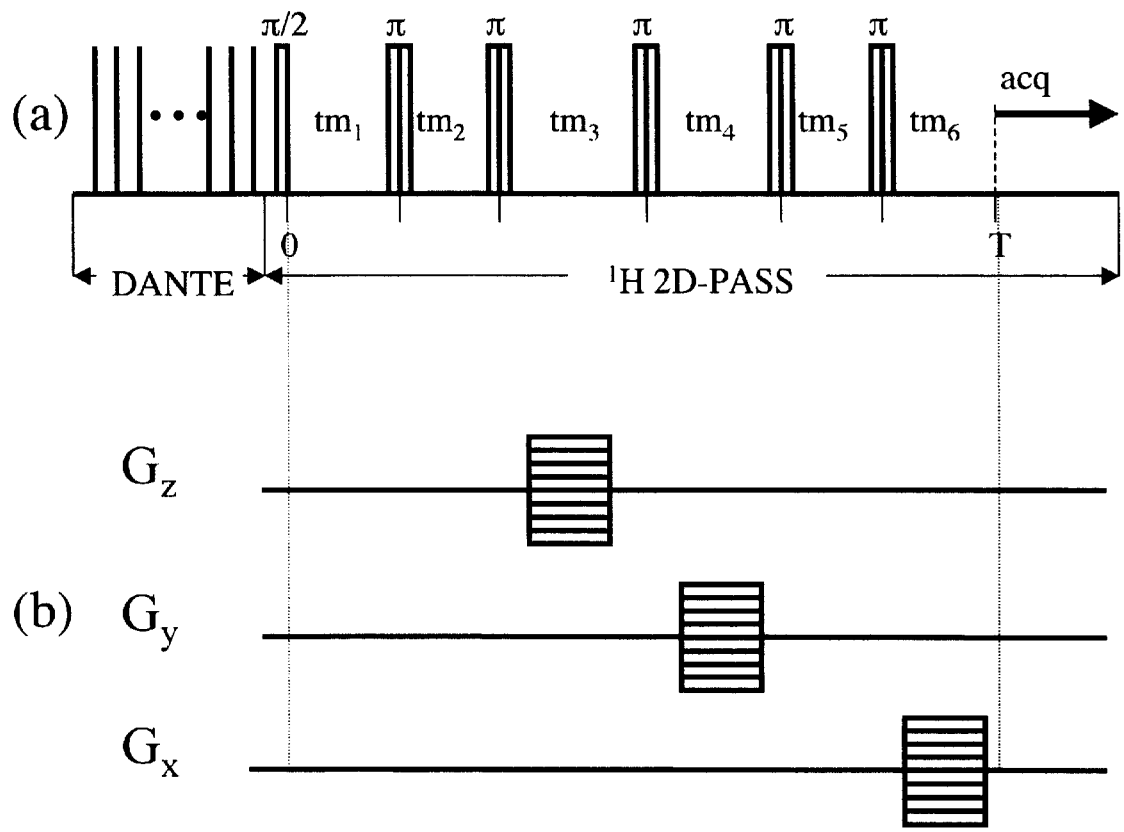

FIG. 14D illustrates a 3D chemical shift imaging pulse sequence utilizing a PASS sequence. The only difference with the 2D-MRI-PASS sequence shown in FIG. 14C is that the readout gradient Gx is replaced by a phase-encoding gradient in the same direction.

FIG. 14E shows an example of volume-selected localized magnetic resonance spectroscopy MRS using PASS. Gx, Gy and Gz are rotating gradients that are rotating synchronously with the sample rotation as described above in connection with FIG. 14A. After the DANTE sequence, a tailored excitation sequence (Ernst et al., Principles of Nuclear Magnetic Resonance in One and Two Dimensions, Oxford University Press Inc., New York, 1997, p. 557) is applied such that the RF spectrum is essentially white except for a dip. Simultaneously, a x-gradient is applied. As a result, all volume elements are saturated except for a slice perpendicular to the x-axis. Then the tailored excitation is repeated in the presence of a y-gradient. As a result, only a tube perpendicular to the y-axis is not saturated. Finally, a selective sinc 90° pulse is applied in the presence of a z-gradient and a volume is therefore excited. For water suppression, a CHESS sequence can be used to replace the DANTE segment.

FIG. 15A shows a localized PHORMAT sequence using rotating gradients. Sequence (a) is the basic PHORMAT sequence that includes the trigger (b), where the pulses located at (I, II and III) positions are sinc selective pulses in the presence of gradients (c) (analogous to the stimulated echo acquisition (STEAM) sequence, see J Frahm et al., J. Magn. Res. 72, 502 (1987)). The black pulses are non-selective 90° pulses and the shaded pulses are non-selective 180° pulses. The gradients labeled with '*' are spoil gradients used to destroy any magnetization that is left in the transverse plane after the black pulses. The (c) pulsed gradients are rotating synchronously with the object. Hence Gx, Gy, and Gz are static in a reference frame rotating synchronously with the object as described above in connection with FIG. 14A. For water suppression, a CHESS sequence can be used to replace the DANTE segment.

FIG. 15B depicts a localized PHORMAT sequence using a static gradient. Sequence (a) is the basic PHORMAT sequence that includes the trigger (b), where the pulses located at (I, II and III) positions are sinc selective pulses applied at the presence of gradient pulses (c). The black pulses are non-selective 90° pulses and the shaded pulses are non-selective 180° pulses. Only the static z-gradient needs to be used since the three sinc pulses are located 120° around the circle of sample rotation provided that the rotation axis (MA) is along the magic angle as illustrated in (d). The gradients labeled with '*' are spoil gradients used to destroy any magnetization that is left in the transverse plane after the black pulses. For water suppression, a CHESS sequence can be used to replace the DANTE segment.

The RF radiation utilized in the pulse sequence of the presently disclosed methods can be generated by RF coils in a MR apparatus as known in the art. The RF pulse sequencing may be generated by techniques known in the art. For example, most modern NMR and MRI spectrometers have pulse programmers and amplifiers that are capable of producing the sequences.

The data for generating a spectrographic analysis based on the disclosed method can be collected by the same coil used for generating the RF radiation, or by a separate receiver coil. A graphical representation of the collected data may be generated by techniques known in the art such as, for example, software programs available on most modern NMR and MRI spectrometers.

The specific examples described below are for illustrative purposes and should not be considered as limiting the scope of the appended claims.

EXAMPLE 1

Sample Preparation

Fresh tissues were excised from four mice, which were genetic mutants of 129/SvJ mice cross-bred with C57BI/6J. The mice used carry hereditary hemochromatosis, a single genetic mutation that results in excess iron deposition in tissues if excess iron is provided in the mouse ration. Tissues analyzed were considered normal, as the ration provided these mice had normal levels of iron. Forty-five days old male and female mice weighing 20 grams were sacrificed by cervical dislocation, tissues were rapidly removed and either immediately analyzed (brain and liver) or stored from two to four hours at 2° C. before analysis (kidney, heart and gluteus muscle). The tissues were inserted into a 7.5-mm outer diameter, 5-mm inner diameter pencil rotor commercially available from Chemagnetics Inc., and were held between two TEFLON plugs in the center of the rotor. All experiments were performed at about 25° C.

Results $^1$H NMR experiments were performed on a Chemagnetics 300 MHz Infinity spectrometer, with a proton Larmor frequency of 299.982 MHz. A standard cross-polarization (CP)/MAS probe with a 7.5-mm pencil type spinner system and an air-flow restriction in the driver channel was used. In this way it was possible to regulate the spinning rate with an accuracy of about ±2 Hz over a spinning range from 43 to 125 Hz. Following conventional practice, the $^1$H spectra are expressed in "ppm" which means part per million of the spectrometer operating frequency.

Figure 3A:
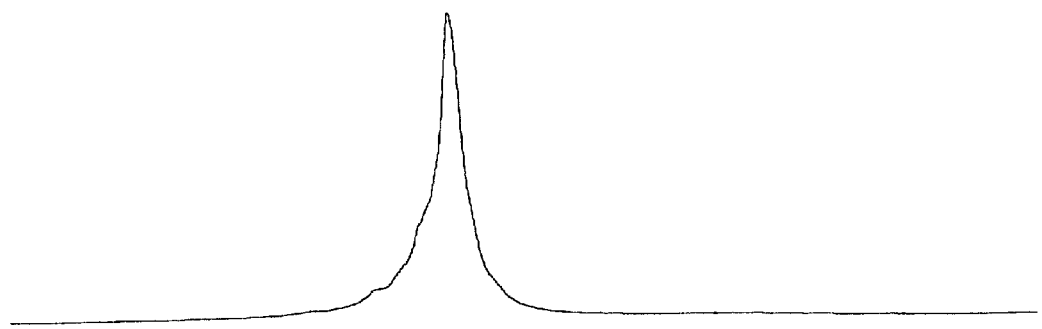
FIGS. 3A and 3B show $^1H$ spectra obtained by analyzing an excised intact mouse brain using conventional NMR techniques and a stationary sample.
Figure 3B:
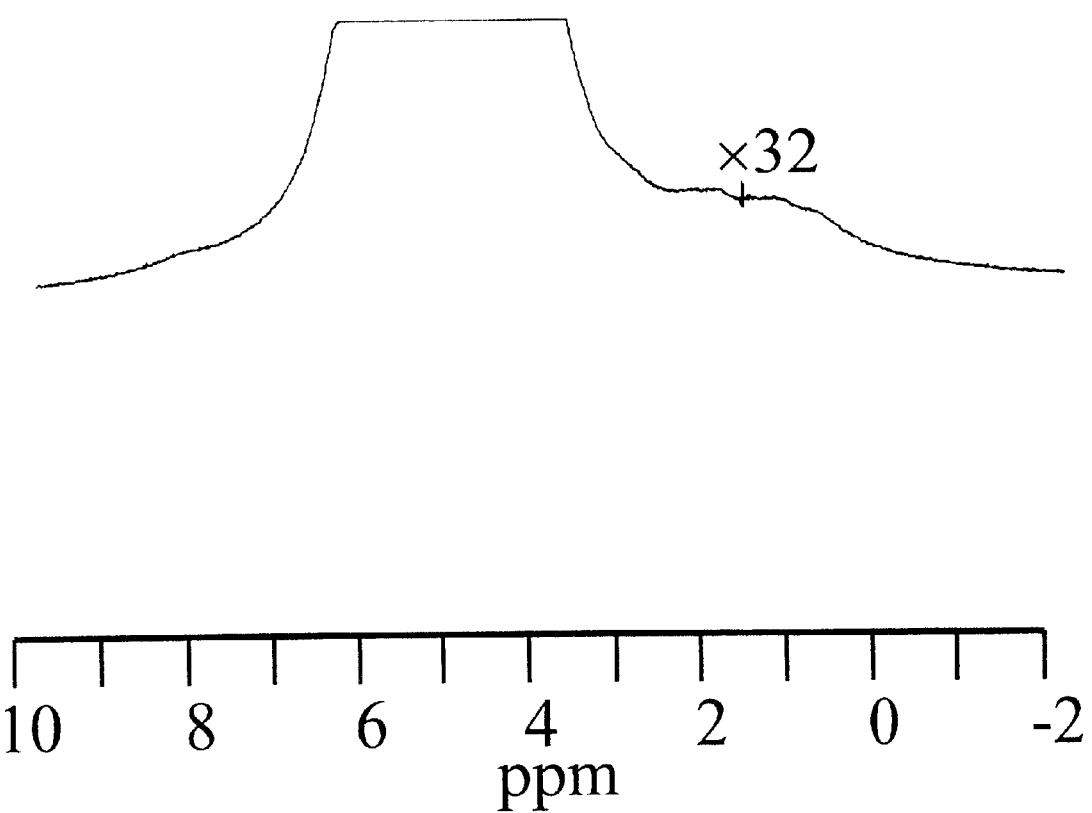

FIGS. 3A and 3B show the Bloch decay 1D spectrum, obtained without water suppression on a static sample of a freshly excised mouse brain in accordance with conventional NMR techniques. The experiments were performed within 15 minutes after the tissue was excised. The spectra were acquired following the excitation of a RF pulse with a tip angle of about 10 degrees. The delay between the end of the pulse and the start of data acquisition was 20 μs. FIG. 3A shows the static spectrum and FIG. 3B shows the same spectrum with a magnification factor of 32. A water line and some barely visible metabolite peaks can be discriminated. The spectral resolution is poor.

Figure 3C:
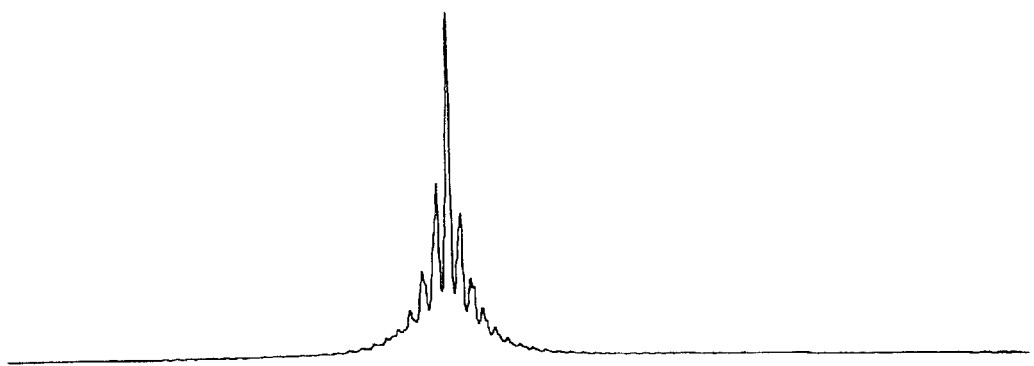
FIGS. 3C and 3D show $^1H$ spectra obtained by analyzing an excised intact mouse using slow MAS but with RF pulse sequencing that did not include a water suppression segment and a MAT segment.
Figure 3D:
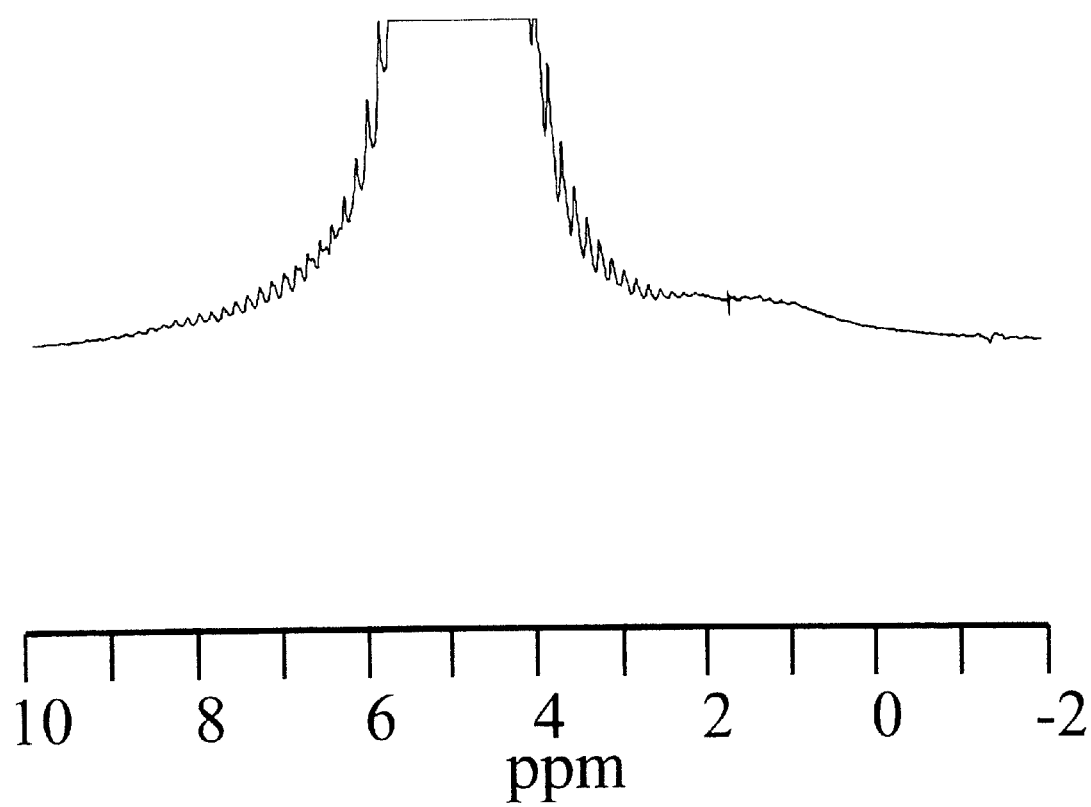

FIG. 3C shows the 1D spectrum of an excised mouse brain tissue undergoing MAS at a frequency of 43 Hz but with a RF pulse sequence that did not include a water suppression segment and a MAT segment. FIG. 3D shows the corresponding 32-fold magnification. The line width (FWHM) of the center band is approximately 13 Hz, which is significantly less than that (105 Hz) of the stationary spectrum. However, the sideband families from the metabolites are superimposed with each other and are also superimposed with SSBs from the water resonance (FIG. 3D), making the assignment of the spectrum impossible.

Figure 4:
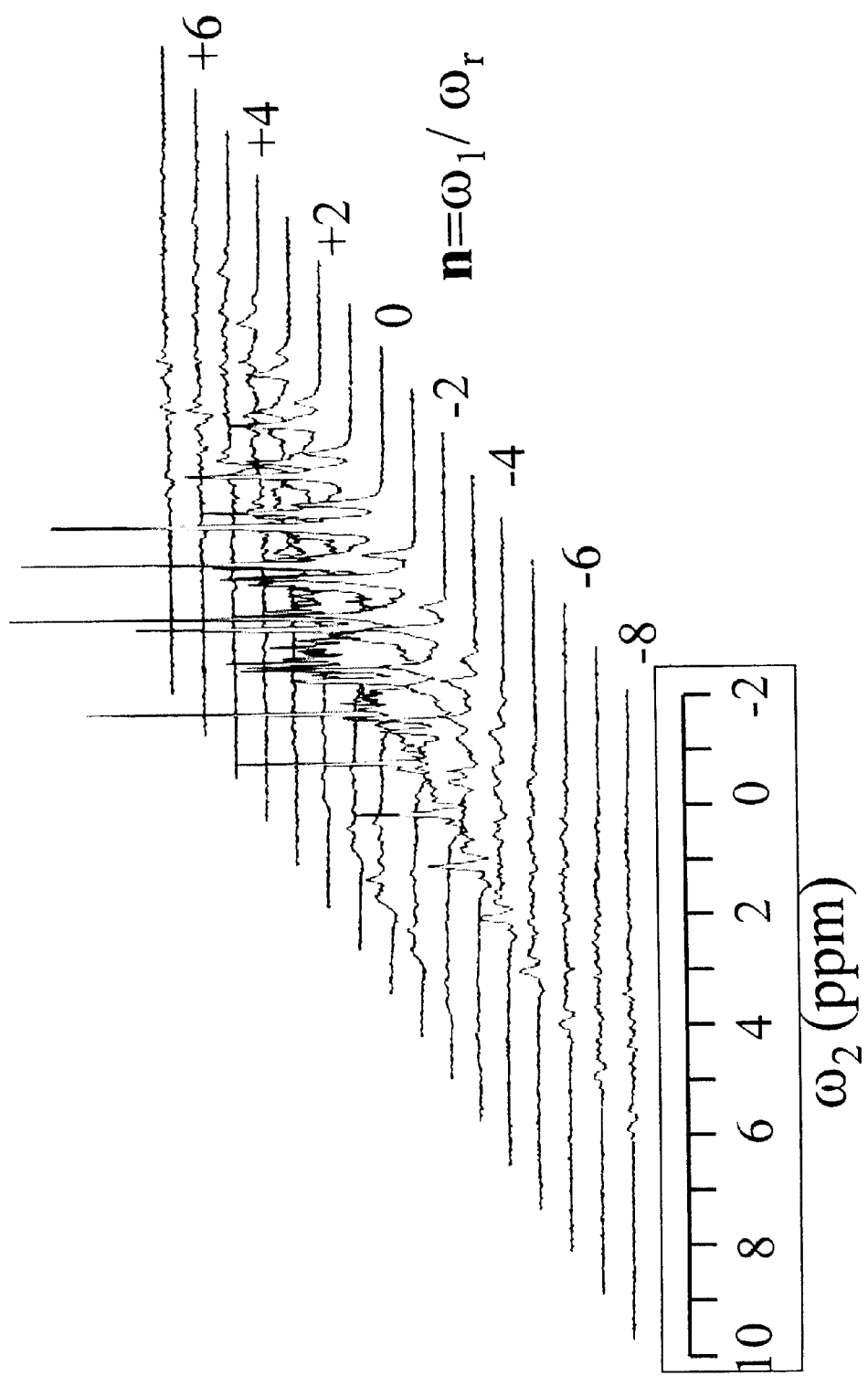
FIG. 4 shows a stacked plot of a $^1H$ 2D-PASS spectra obtained by analyzing an excised intact mouse brain using one embodiment of the presently disclosed methods.

FIG. 4 shows the stacked plot of the $^1$H 2D-PASS spectrum of the same brain tissue as in FIG. 3 acquired at a sample spinning rate of 43 Hz. In this case water suppression was used. This was achieved by applying the DANTE pulse sequence at the center band of the water spectrum. In this way, both the signal arising from the center band and the SSBs are saturated. The parameter n denotes the nth sideband, n=0 corresponds to the center band. The spectrum was acquired 24 minutes after the brain was excised. Sixteen evolution increments were used, each with 96 phase increments, resulting in a total of 1,536 acquisitions. The recycle delay time was 2s, resulting in an experimental time of about 52 minutes. The $^1$H $\pi/2$ pulse width was 9 microseconds. The DANTE sequence contained 4000 pulses spaced by 100 $\mu$microseconds, each of which was 1 microsecond. In FIG. 4 $\omega_2$ denotes the acquisition dimension, $\omega_1$ denotes the evolution dimension and $\omega_r$ denotes the angular spinning frequency.

FIG. 5A shows the (water-suppressed) proton spectrum, obtained by projecting the 2D-PASS data into the normal acquisition ($\omega_2$) dimension. This spectrum reflects the result of a standard 1D experiment applied at 43 Hz. Due to the overlapping of the SSB families from different metabolites, even with water suppression such a 1D spectrum is difficult to interpret. FIGS. 5B and 5C display the n=0 center-band spectrum and the isotropic projection, respectively. Despite the relatively short $T_2$ weighting time of one rotor period used in the 2D-PASS experiment (~23.3 msec in this case), an impressive spectral resolution is observed, indicating that the line broadening observed in the brain can be removed efficiently using the 2D-PASS experiment. The relative intensities of the various lines in the isotropic projection spectrum (FIG. 5C) are slightly different from those in the center-band spectrum (FIG. 5B), which is a result of differences in the anisotropy patterns of the various lines. Also, the spectral resolution in the isotropic spectrum is somewhat less than that of the center band. This is due to the slight instability of the spinning rate, which has almost no effect on the center-band spectrum but broadens the lines in the side-band spectra, increasing with the order of the sideband. FIG. 5D shows the brain spectrum, obtained from a standard 1D fast MAS experiment at a spinning rate of 4.3 kHz. It follows that despite the much larger spinning rate the spectral resolution is actually less than that of the center-band spectrum obtained from 2D-PASS. This is, in part, due to the intrinsic 23.3-msec $T_2$ weighting employed in the latter experiment. This is shown in FIG. 5E, where the same spectrum is shown after using a 23 msec $T_2$ weighting, obtained by applying a $\pi$ pulse train. Even in this case the width of the lines are about 8 Hz broader than those in the center-band spectrum of 2D-PASS, causing an apparent relative intensity drop for the two narrowest resonance lines at 2.0 and 3.0 ppm, which are from N-acetylaspartate and creatine, respectively. This extra broadening is probably caused by an increased $B_0$ inhomogeneity along the spinning axis induced by the 4.3 kHz spinning, which is not averaged out by the spinning. The fast spinning pushes the sample against the rotor wall and creates a hole in the middle, resulting in increased bulk susceptibility gradients at the boundary of the sample and the hole.

FIGS. 6A, 6B and 6C illustrate the effects of such rapid sample spinning. In this figure the static water line is shown before spinning (FIG. 6A), after spinning at 43 Hz (FIG. 6B), and after spinning at 4.3 kHz (FIG. 6C). It follows that the slow spinning hardly affects the line shape, but that the sample deformation due to the fast spinning causes severe line broadening. We found that repacking the rotor after the fast spinning produced a similar spectrum as shown in FIG. 6A, proving that the sample deformation is the cause of this broadening. Hence, in order to avoid this effect in a fast spinning experiment it is necessary to use densely-packed samples in a spherical sample holder. By using slow sample spinning as in the presently described methods, this problem is avoided.

FIGS. 7A and 7B show the spectra on a mouse heart using 2D-PASS and water suppression at 80 Hz according to the presently disclosed method (7A) and using 1D-MAS and water suppression at 4.4 kHz (7B). FIGS. 7C and 7D show the spectra on a mouse liver using 2D-PASS and water suppression at 100 Hz according to the presently disclosed method (7C) and using 1D-MAS and water suppression at 3.3 kHz (7D). FIGS. 7E and 7F show the spectra on a mouse gluteus muscle using 2D-PASS and water suppression at 125 Hz according to the presently disclosed method (7E) and using 1D-MAS and water suppression at 4.2 kHz (7F). FIGS. 7G and 7H show the spectra on a mouse kidney using 2D-PASS and water suppression at 100 Hz according to the presently disclosed method (7G) and using 1D-MAS and water suppression at 5.7 kHz (7H). It is clear from FIGS. 7A–7F that for the heart, liver, and gluteus muscle both slow MAS and fast MAS methods provide spectra with very similar resolutions and intensities. In the kidney (FIGS. 7G and 7H) the lines obtained with fast spinning are somewhat broader than those obtained with slow MAS, which may be caused again by extra susceptibility gradients imposed by the spinning.

These results demonstrate that the presently disclosed slow spinning methods produce spectral resolutions that are similar, and in some cases even better, compared to spectral resolutions obtained with fast MAS.

EXAMPLE 2

Sample Preparation

The experiments described below were performed on excised rat liver tissues, obtained from Fisher 344 male rats. The liver was chosen because the proton lines obtained on static samples are found to be so broad that resolution of the various metabolites is difficult or impossible. Prior to removing the livers from the animals, the rats were sacrificed by $CO_2$ asphyxiation. Before loading the sample into the NMR rotor, about 200 mg of liver was cut into small pieces (approximately 2 mm in size), and randomly selected aliquots were inserted into the rotor to provide a more or less isotropic sample.

Two different sample preparations were used. In the first case the excised liver was loaded into the NMR rotor immediately after the cutting. Hence the results obtained in this sample may be an indication of what can be expected in in vivo experiments. In the second case the excised liver was prepared in the same way as described in Bollard et al., *High-Resolution $^1H$ and $^1H$-$^{13}C$ Magic Angle Spinning NMR Spectroscopy of Rat Liver*, Magn. Reson. Med. 2000; 44:201–207, i.e., the liver was perfused with saline to remove residual blood and was then snap-frozen using liquid nitrogen and stored at −80° C. until required. Also, prior to the actual experiments the frozen sample was kept in the rotor for about 19 hours. It was found that the sample degradation associated with this procedure causes a significant increase in the spectral resolution, albeit at the cost of serious changes in the various line intensities. Hence this sample provides a more sensitive way of comparing the spectral resolution obtainable with the various experiments than the first one. The liver pieces were loaded between two Teflon plugs within a 7.5-mm OD, 5-mm ID Chemagnetics pencil rotor. The parts were slowly pushed into the rotor to avoid large air bubbles in the sample region in the rotor. All experiments were performed at room temperature, i.e. 25° C.

Results $^1H$ NMR experiments were performed on a Chemagnetics 300 MHz Infinity spectrometer, with a proton Larmor frequency of 299.982 MHz. A standard Chemagnetics CPI-MAS probe with a 7.5-mm pencil type spinner system was used. In order to be able to spin at low frequencies, the rotor was equipped with a flat drive tip (i.e. it did not contain grooves, which are normally used to drive the rotor) and an airflow restriction was used in the driver channel. The spinning rate was controlled using a commercial Chemagnetics MAS speed controller under the automated control mode. Spinning rates as high as 5 kHz could be reached after removing the airflow restriction in the driver channel and by replacing the flat drive tip with a standard tip. Following conventional practice, the $^1H$ spectra are expressed in "ppm" which means part per million of the spectrometer operating frequency.

A modified PHORMAT sequence as depicted in FIG. 8 was applied to the rat livers. The echo time ($\Delta$) and the recycle delay times were 50 $\mu$s and 1 s, respectively. The free-induction decays in the acquisition dimension ($t_2$) contained 300 complex points and were transformed to spectra with a spectral width of 8 kHz. The 2D data were collected using 100 $t_1$ steps, incremented 700 $\mu$s, corresponding to a maximum evolution time of 70 ms and an evolution spectral width of 1.282 kHz. 2D data sets were acquired with the (+) and the (−) PHORMAT pulse sequences using a total of 64 scans at each $t_1$ value, resulting in a total measuring time of about 3.0 hours. Hyper-complex 2D data sets were constructed according to the procedure detailed in Hu et al., *Magic-Angle-Turning Experiments for Measuring Chemical-Shift-Tensor Principal Values in Powdered Solids*, J. Magn. Reson. 1995: A 113: 210–222 using a macro driven program developed on the Chemagnetics Infinity Spectrometer. The pulse width was 9.5 $\mu$s. The DANTE sequence consisted of 2000 RF pulses spaced by 100 $\mu$s and with a pulse width of 0.8 $\mu$s for each pulse, resulting in a cumulative flip angle of 15,200 degrees and a $\tau$ value of approximately 202 ms.

Figures 9A, 9B:
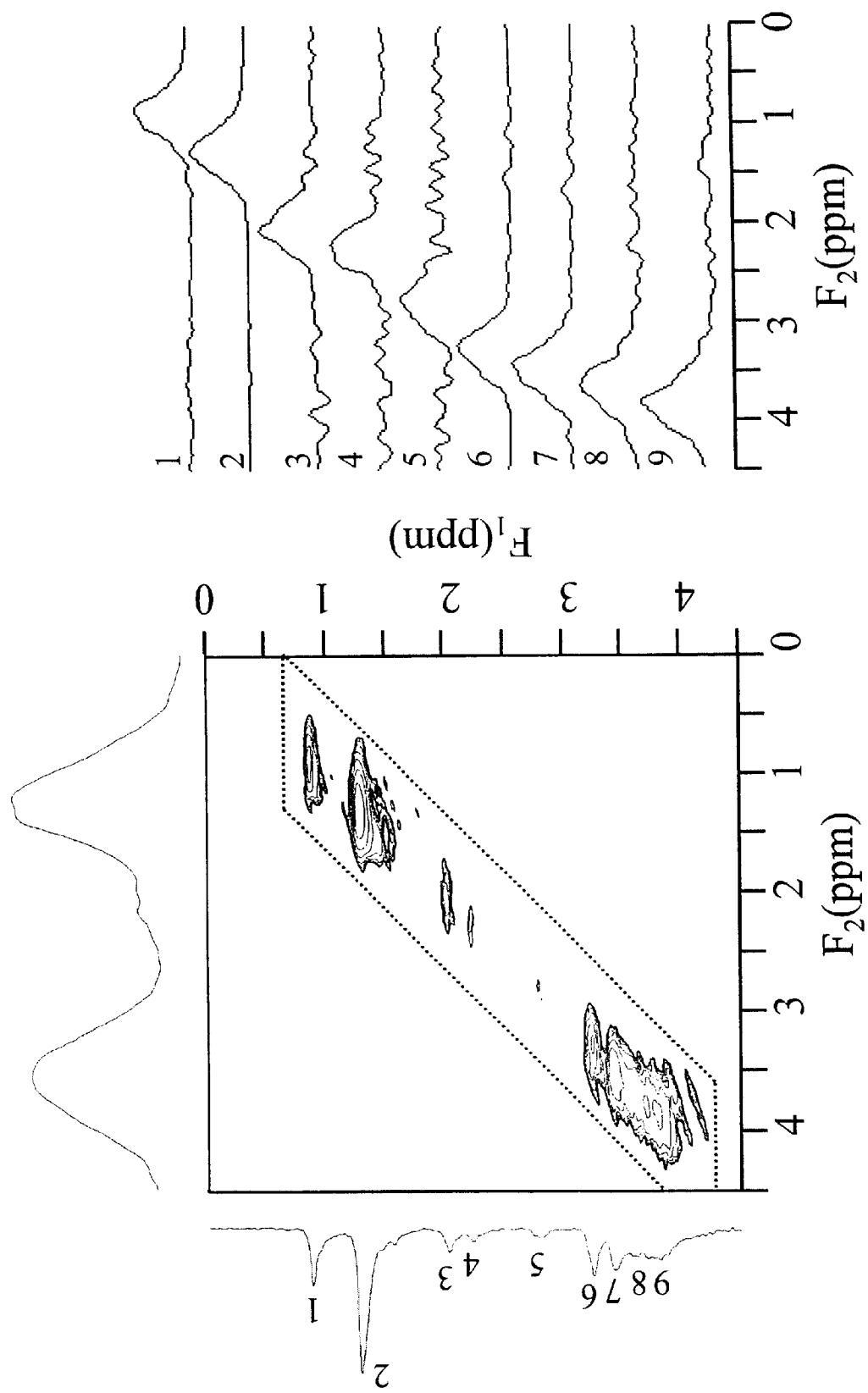
FIGS. 9A and 9B show $^1H$ PHORMAT spectra obtained by analyzing excised rat liver tissue using one embodiment of the presently disclosed methods.

FIGS. 9A and 9B show $^1H$ PHORMAT spectra of the fresh liver sample, obtained at a spinning rate of 1 Hz. FIG. 9A displays the 2D plot together with the projections along the isotropic $F_1$ ($t_1$) and anisotropic $F_2$ ($t_2$) dimensions, respectively. In order to reduce the noise in the projection along the isotropic dimension, only the part in the 2D plot containing the spectral information was used, i.e. the information inside the band indicated in FIG. 9A. In this way the signal-to-noise was enhanced by a factor of 3–4 compared with the case that the full areas were used to generate the projection. By making slices parallel to the $F_2$ axis, the anisotropic line shapes of each isotropic peak can be determined separately, nine of which are plotted in FIG. 9B.

It follows from FIGS. 9A and 9B that substantial line narrowing is obtained with PHORMAT. For example, the width of the anisotropic line of the methyl peak at 0.9 ppm in FIG. 9B is about 150 Hz, while the isotropic line width is about 15 Hz, indicating that a line narrowing factor of about 10 has been achieved.

FIGS. 10A, 10B, 10C and 10D show spectra of the fresh liver sample obtained with different methods. FIG. 10A shows the anisotropic ($F_2$) projection of the PHORMAT 2D spectrum (cf. FIG. 9A), which is the same as the spectrum obtained on a static sample. FIG. 10B shows the isotropic projection ($F_1$) projection of the PHORMAT 2D spectrum, given in FIG. 9A. FIG. 10C displays the centerband spectrum obtained by a 2D-PASS sequence that included a DANTE sequence and was acquired at a spinning rate of 40 Hz. Sixteen evolution steps were acquired, each of which has 32 accumulations with a recycle time of 1.4 s. FIG. 10D shows a spectrum obtained with a comparative standard fast MAS at a spinning rate of 4 kHz with water suppression using DANTE, which was acquired using the PASS sequence with the five 180° pulses equally spaced apart during a period of 25 ms. Thirty-two scans with a recycle delay time of 1.4 s were used.

It follows that significant resolution enhancements were obtained by PHORMAT, PASS, and fast MAS. However, the 2D-PASS at a spinning rate of 40 Hz (FIG. 10C) gives the best resolution, even better than that of fast MAS (FIG. 10D), where additional $B_0$ inhomogeneity broadening may have been induced by the spinning itself. It is estimated that compared with the line widths observed with PASS, the widths in a MAS and PHORMAT experiment are increased by 2 and 5 Hz, respectively. This reduced spectral resolution in PHORMAT may be due to experimental imperfections such as an error in the rotor markings, residual anisotropy in the sample packing, short-term spinning instability, and the drift of the main magnetic field (no field lock was applied during the relatively long measuring time (3 hours)). Moreover, the increased broadening may be caused by molecular diffusion during the evolution and storage time of the magnetization.

Figure 11A:
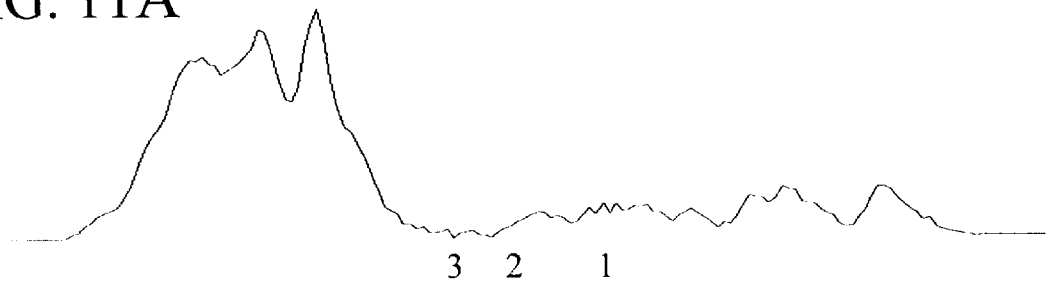
FIGS. 11A, 11B and 11C show $^1H$ spectra obtained by analyzing excised rat liver tissue using embodiments of the presently disclosed methods.
Figure 11B:
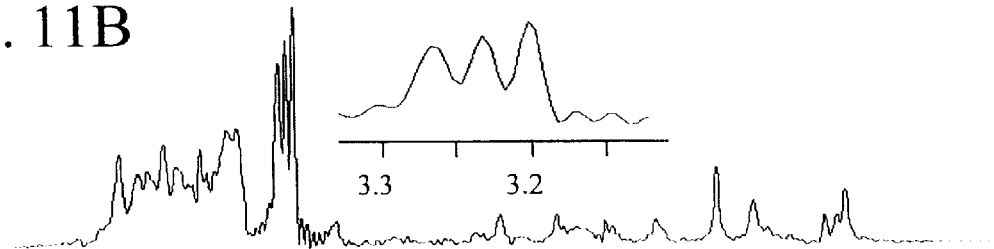
Figure 11C:
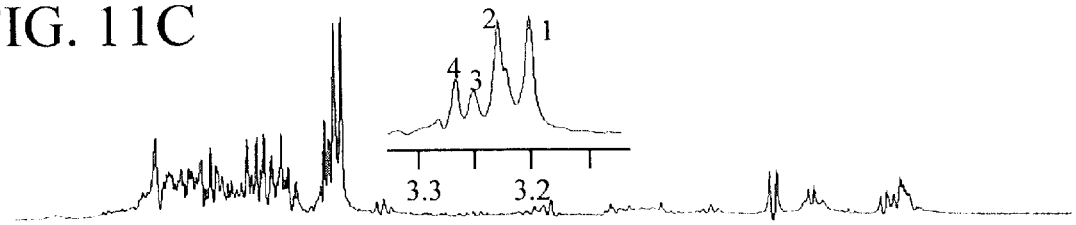
Figure 11D:
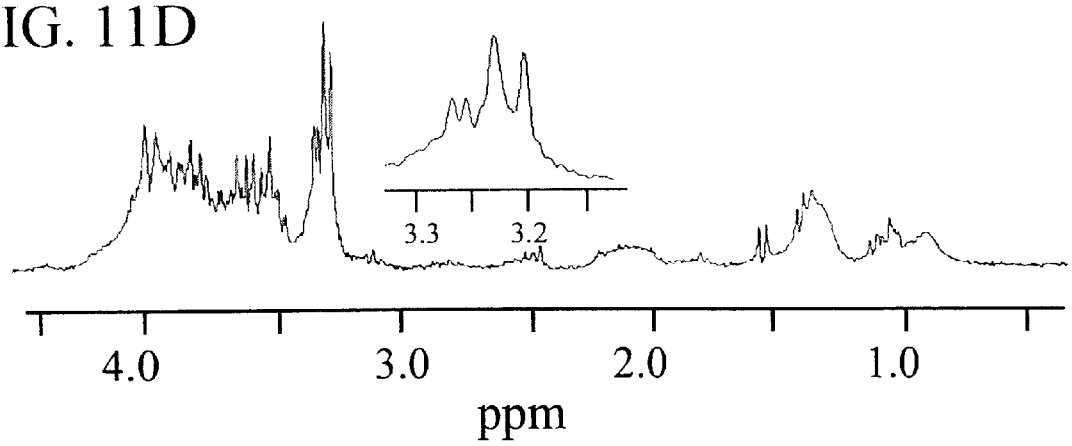
FIG. 11D shows $^1H$ spectra obtained by analyzing excised rat liver tissue using fast MAS.

FIGS. 11A, 11B, 11C and 11D show the $^1H$ spectra of the treated and aged liver sample obtained with 1 Hz PHORMAT (FIGS. 11A, 11B), 40 Hz 2D-PASS (FIG. 11C), and 4 kHz MAS (FIG. 11D). The PHORMAT results were acquired using the same experimental parameters as those with respect to FIGS. 9A and 9B except that the number of evolution increments was doubled to 200 to accommodate the increased line narrowing in the aged sample. The 2D-PASS results were acquired using the same experimental parameters as those with respect to FIG. 10C except that the accumulation number for each evolution increment is increased to 64. The MAS results were acquired using the same experimental parameters as those with respect to FIG. 10D except that the number of scans was increased to 96.

In this sample all experiments produced spectra with a significantly higher resolution than in the fresh untreated sample. More than 23 peaks can be distinguished in FIG. 11B, four of which are highlighted in the figure. These peaks correspond to 1): Choline methyl, 2): phosphocholine methyl and 3&4): glucose and trimethylamine-N-oxide methyl. It follows from FIGS. 11A and 11B, which display the anisotropic ($F_2$) and isotropic ($F_1$) projections of the PHORMAT experiment, respectively, that also in the aged sample substantial line narrowing is obtained with PHORMAT. For example, the average anisotropic line width of peaks 1–4 is about 55 Hz, while the isotropic line widths of these peaks is about 4 Hz. Hence in this sample the narrowing factor is approximately 14, comparable to the factor 10 obtained in the fresh sample. These isotropic widths approach those observed with 2D-PASS (2 Hz) and fast MAS (3 Hz). Again 2D-PASS (FIG. 4c) offers the highest resolution, consistent with the results obtained on the fresh sample.

It follows from the above that substantial spectral resolution enhancements can be obtained with PHORMAT. The above-detailed results are unexpectedly good, as it was anticipated that the diffusion of the molecules in the susceptibility gradients would result in severe line broadening at lower spinning speeds.

Having illustrated and described the principles of our invention with reference to several preferred embodiments, it should be apparent to those of ordinary skill in the art that the invention may be modified in arrangement and detail without departing from such principles.

What is claimed is:

1. A method of performing a magnetic resonance analysis of a biological object comprising:
   placing the biological object in a main magnetic field and in a radio frequency field, the main magnetic field having a static field direction;
   rotating the biological object at a rotational frequency of less than about 100 Hz around an axis positioned at an angle of about 54°44' relative to the main magnetic static field direction;
   pulsing the radio frequency to provide a pulse sequence that includes a phase-corrected magic angle turning pulse segment and a water suppression pulse segment; and
   collecting data generated by the pulsed radio frequency.

2. A method according to claim 1 wherein the water suppression pulse segment comprises a DANTE sequence.

3. A method according to claim 1 wherein the biological object is rotated at a rotational frequency of about 1 to about 100 Hz.

4. A method according to claim 1 wherein the main magnetic field remains stationary during the biological object rotation.

5. A method according to claim 1 wherein the phase-corrected magic angle turning pulse segment includes at least a first 90° pulse, a second 90° pulse, and a third 90° pulse, and the water suppression pulse segment is performed immediately prior to the third 90° pulse.

6. A method according to claim 1 wherein the biological object is rotated at a rotational frequency of about 1 to about 50 Hz.

7. A method according to claim 1 wherein the biological object comprises a fluid object.

8. A method of performing a magnetic resonance analysis of a biological object comprising:
   placing the biological object in a main magnetic field and in a radio frequency field, the main magnetic field having a static field direction;
   rotating the biological object at a rotational frequency of less than about 100 Hz around an axis positioned at an angle of about 54°44" relative to the main magnetic static field direction;
   pulsing the radio frequency to provide a pulse sequence that includes a phase-corrected magic angle turning pulse segment comprising an initial $\pi/2$ pulse; and
   collecting data generated by the pulsed radio frequency.

9. A method of performing a magnetic resonance analysis of a biological object comprising:
   subjecting the biological object to a main magnetic field and a pulsed radio frequency field, the main magnetic field having a static field direction;
   rotating the biological object at a rotational frequency of less than about 100 Hz around an axis positioned at an angle of about 54°44' relative to the main magnetic static field direction;
   controlling the pulsed radio frequency to provide a sequence that includes a phase-corrected magic angle turning pulse segment and a water suppression pulse segment; and
   generating a magnetic resonance analysis of the response by nuclei in the biological object to the pulsed radio frequency sequence.

10. A method according to claim 9 wherein the biological object is rotated at a rotational frequency of about 1 to about 100 Hz.

11. A method according to claim 9 wherein the water suppression pulse segment comprises a DANTE sequence.

12. A method according to claim 9 wherein the phase-corrected magic angle turning pulse segment includes an initial $\pi/2$ pulse.

13. A method according to claim 9 wherein the phase-corrected magic angle turning pulse segment includes at least a first 90° pulse, a second 90° pulse, and a third 90° pulse, and the water suppression pulse segment is performed immediately prior to the third 90° pulse.

14. A method according to claim 9 wherein the biological object is rotated at a rotational frequency of about 1 to about 50 Hz.

15. A method of performing a magnetic resonance analysis of a biological object comprising:
   placing the biological object in a main magnetic field and in a radio frequency field, the main magnetic field having a static field direction;
   rotating the biological object at a rotational frequency of less than about 10 Hz around an axis positioned at an angle of about 54°44' relative to the main magnetic static field direction;
   pulsing the radio frequency to provide a pulse sequence that includes a magic angle turning pulse segment; and
   collecting data generated by the pulsed radio frequency.

16. A method according to claim 15 wherein the biological object comprises a fluid object.

17. A method according to claim 15 wherein the magic angle turning pulse segment comprises a phase-corrected magic angle turning pulse segment.

18. A method according to claim 15 wherein the pulse sequence further comprises a water suppression pulse segment.

19. A method according to claim 15 wherein the biological object is rotated at a rotational frequency of less than about 3 Hz.

20. A method according to claim 18 wherein the water suppression pulse segment comprises a DANTE sequence.

21. A method according to claim 17 wherein the phase-corrected magic angle turning pulse segment includes at least a first 90° pulse, a second 90° pulse, and a third 90° pulse, the method further comprising
   performing a water suppression pulse segment immediately prior to the third 90° pulse.

22. A method of performing a magnetic resonance analysis of a biological object comprising:
   subjecting the biological object to a main magnetic field and a pulsed radio frequency field, the main magnetic field having a static field direction;
   rotating the biological object at a rotational frequency of less than about 10 Hz around an axis positioned at an angle of about 54°44' relative to the main magnetic static field direction;
   controlling the pulsed radio frequency to provide a sequence that includes a magic angle turning pulse segment; and
   generating a magnetic resonance analysis of the response by nuclei in the biological object to the pulsed radio frequency sequence.

23. A method according to claim 22 wherein the magic angle turning pulse segment comprises a phase-corrected magic angle turning pulse segment.

24. A method according to claim 22 wherein the sequence further comprises
   a water suppression pulse segment.

25. A method according to claim 22 wherein the biological object is rotated at a rotational frequency of less than about 3 Hz.

26. A method according to claim 24 wherein the water suppression pulse segment comprises a DANTE sequence.

27. A method according to claim 23 wherein the phase-corrected magic angle turning pulse segment includes at least a first 90° pulse, a second 90° pulse, and a third 90° pulse, the method further comprising
   performing a water suppression pulse segment immediately prior to the third 90° pulse.

28. A method of performing a magnetic resonance analysis of a biological fluid object comprising:
   placing the biological fluid object in a main magnetic field and in a radio frequency field, the main magnetic field having a static field direction;
   rotating the biological fluid object at a rotational frequency of about 20 to about 100 Hz around an axis positioned at an angle of about 54°44' relative to the main magnetic static field direction;
   pulsing the radio frequency to provide a pulse sequence that includes a 2D-phase-altered spinning sidebands pulse segment; and
   collecting data generated by the pulsed radio frequency.

29. A method of performing a magnetic resonance analysis of a biological fluid object comprising:
   placing the biological fluid object in a main magnetic field and in a radio frequency field, the main magnetic field having a static field direction;
   positioning the biological fluid object along a magic axis located at an angle of about 54°44' relative to the main magnetic static field direction;
   reorienting the biological fluid object about the magic angle axis between three predetermined positions, the three predetermined positions being related to each other by 120°;
   pulsing the radio frequency to provide a pulse sequence capable of producing a spectrum that is substantially free of anisotropic broadening; and
   collecting data generated by the pulsed radio frequency.

30. A method according to claim 29 wherein the magnetic resonance analysis comprises magnetic resonance imaging and the radio frequency pulse sequence includes a magic angle turning pulse segment, the method further comprising:
   placing the biological object in at least one pulsed magnetic field gradient;
   pulsing the radio frequency and pulsed magnetic field gradient to generate spatially-selective nuclear magnetic resonance data; and
   generating a magnetic resonance analysis of the response by nuclei in the biological object to the pulsed radio frequency sequence.

31. A method of performing a magnetic resonance analysis of a biological object comprising:
   providing a main magnetic field that includes a first component having a static field direction and an amplitude and a second and a third component, each second and third component having a sinusoidal field in a plane perpendicular to the static field direction of the first component and with an amplitude that is $2^{1/2}$ times the amplitude of the static field of the first component, wherein the second and third components produce a magnetic field that rotates in a plane perpendicular to the static field direction at a frequency of less than about 100 Hz resulting in an overall field that is rotating around an axis located at an angle of about 54°44' relative to the static field direction of the first component;
   placing the biological object in the main magnetic field and in a radio frequency field;
   pulsing the radio frequency to provide a pulse sequence capable of producing a spectrum that is substantially free of spinning sideband peaks; and
   collecting data generated by the pulsed radio frequency.

32. A method according to claim 31 wherein the magnetic resonance analysis comprises magnetic resonance imaging and the radio frequency pulse sequence includes a magic angle turning pulse segment, the method further comprising:
   placing the biological object in at least one pulsed magnetic field gradient;
   pulsing the radio frequency and pulsed magnetic field gradient to generate spatially-selective nuclear magnetic resonance data; and
   generating a magnetic resonance analysis of the response by nuclei in the biological object to the pulsed radio frequency sequence.

33. A method according to claim 31 wherein the biological object comprises a fluid object.

34. A method of performing a magnetic resonance analysis of a biological object comprising:
   placing the biological object in a main magnetic field and in a radio frequency field, the main magnetic field having a static field direction;
   mechanically rotating a magnet around an axis at an angle of about 54°44' relative to the main magnetic static field direction at a rotational frequency of less than about 100 Hz;
   pulsing the radio frequency to provide a pulse sequence capable of producing a spectrum that is substantially free of spinning sideband peaks; and
   collecting data generated by the pulsed radio frequency.

35. A method according to claim 34 wherein the magnetic resonance analysis comprises magnetic resonance imaging and the radio frequency pulse sequence includes a magic angle turning pulse segment, the method further comprising:
   placing the biological object in at least one pulsed magnetic field gradient;
   pulsing the radio frequency and pulsed magnetic field gradient to generate spatially-selective nuclear magnetic resonance data; and generating a magnetic resonance analysis of the response by nuclei in the biological object to the pulsed radio frequency sequence.

36. A method according to claim 34 wherein the biological object comprises a fluid object.

37. A method of performing a magnetic resonance analysis of a biological object comprising:

placing the biological object in a main magnetic field and in a radio frequency field, the main magnetic field having a static field direction;

rotating the biological object at a rotational frequency of less than about 50 Hz around an axis positioned at a magic angle of about 54°44' relative to the main magnetic static field direction;

rotating the main magnetic field at a rotational frequency of less than about 50 Hz around the magic angle axis such that the main magnetic field and the biological object rotate simultaneously in an opposite rotational direction;

pulsing the radio frequency to provide a pulse sequence capable of producing a spectrum that is substantially free of spinning sideband peaks; and collecting data generated by the pulsed radio frequency.

38. A method according to claim 37 wherein the magnetic resonance analysis comprises magnetic resonance imaging and the radio frequency pulse sequence includes a magic angle turning pulse segment, the method further comprising:

placing the biological object in at least one pulsed magnetic field gradient;

pulsing the radio frequency and pulsed magnetic field gradient to generate spatially-selective nuclear magnetic resonance data; and generating a magnetic resonance analysis of the response by nuclei in the biological object to the pulsed radio frequency sequence.

39. A method according to claim 37 wherein the biological object comprises a fluid object.

40. A method of magnetic resonance imaging of a biological fluid object comprising:

subjecting the biological fluid object to a main magnetic field, a pulsed radio frequency field, and at least one pulsed magnetic field gradient, the main magnetic field having a static field direction;

rotating the biological fluid object at a rotational frequency of less than about 100 Hz around an axis positioned at an angle of about 54°44" relative to the main magnetic static field direction;

controlling the pulsed radio frequency to provide a pulse sequence that includes a magic angle turning pulse segment;

pulsing the pulsed radio frequency and pulsed magnetic field gradient to generate spatially-selective nuclear magnetic resonance data; and generating a magnetic resonance analysis of the response by nuclei in the biological fluid object to the pulsed radio frequency sequence.

41. A method according to claim 40 wherein the biological fluid object is rotated at a rotational frequency of about 1 to about 50 Hz, and the pulse sequence includes a phase-corrected magic angle turning pulse segment.

42. A method according to claim 41 wherein the biological fluid object is rotated at a rotational frequency of less than about 10 Hz.

43. A method according to claim 40 wherein the biological fluid object is rotated at a rotational frequency of at least about 20 Hz, and the pulse segment includes a 2D-phase-altered spinning sidebands pulse segment.

44. A method of magnetic resonance imaging of a biological fluid object comprising:

placing the biological fluid object in a main magnetic field and in a radio frequency field, the main magnetic field having a static field direction;

rotating the biological fluid object at a rotational frequency of less than about 100 Hz around an axis positioned at an angle of about 54°44' relative to the main magnetic static field direction;

pulsing the radio frequency to provide a pulse sequence that includes a phase-corrected magic angle turning pulse segment; and collecting data generated by the pulsed radio frequency.

45. A method according to claim 44 wherein the pulse sequence further comprises a water suppression pulse segment.

46. A method according to claim 44 wherein the biological fluid object is rotated at a rotational frequency of about 1 to about 50 Hz.

47. A method of magnetic resonance imaging of a biological object comprising:

subjecting the biological object to a main magnetic field, a pulsed radio frequency field, and at least one pulsed magnetic field gradient, the main magnetic field having a static field direction;

rotating the biological object at a rotational frequency of less than about 10 Hz around an axis positioned at an angle of about 54°44' relative to the main magnetic static field direction;

controlling the pulsed radio frequency to provide a pulse sequence that includes a magic angle turning pulse segment;

pulsing the pulsed radio frequency and pulsed magnetic field gradient to generate spatially-selective nuclear magnetic resonance data; and generating a magnetic resonance analysis of the response by nuclei in the biological object to the pulsed radio frequency sequence.

48. A method according to claim 47 wherein the pulse sequence further comprises a water suppression pulse segment.

49. A method according to claim 47 wherein the water suppression pulse segment comprises a DANTE sequence.

50. A method of magnetic resonance imaging of a biological object comprising:

subjecting the biological object to a main magnetic field, a pulsed radio frequency field, and at least one pulsed magnetic field gradient, the main magnetic field having a static field direction;

rotating the biological object at a rotational frequency of less than about 100 Hz around an axis positioned at an angle of about 54°44' relative to the main magnetic static field direction;

controlling the pulsed radio frequency to provide a pulse sequence that includes a magic angle turning pulse segment and a water suppression pulse segment;

pulsing the pulsed radio frequency and pulsed magnetic field gradient to generate spatially-selective nuclear magnetic resonance data; and generating a magnetic resonance analysis of the response by nuclei in the biological object to the pulsed radio frequency sequence.

51. A method according to claim 50 wherein the water suppression pulse segment comprises a DANTE sequence.

52. A method according to claim 50 wherein the biological object is rotated at a rotational frequency of about 1 to about 50 Hz, and the pulse sequence includes a phase-corrected magic angle turning pulse segment.

53. A method according to claim 50 wherein the biological object is rotated at a rotational frequency of at least about 20 Hz, and the pulse segment includes a 2D-phase-altered spinning sidebands pulse segment.

* * * * *